US 6,573,700 B2

(12) United States Patent
Zhang et al.

(10) Patent No.: US 6,573,700 B2
(45) Date of Patent: Jun. 3, 2003

(54) METHOD OF CHARACTERIZING FREE-SPACE RADIATION USING A CHIRPED OPTICAL PULSE

(75) Inventors: Xi-Cheng Zhang, Latham, NY (US); Zhiping Jiang, Ottawa (CA)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 10/164,454

(22) Filed: Jun. 6, 2002

(65) Prior Publication Data

US 2003/0001558 A1 Jan. 2, 2003

Related U.S. Application Data

(60) Division of application No. 09/617,242, filed on Jul. 14, 2000, now Pat. No. 6,414,473, which is a continuation of application No. PCT/US99/02922, filed on Feb. 10, 1999, said application No. 09/617,242, filed on Jul. 14, 2000, now Pat. No. 6,414,473, and a continuation-in-part of application No. 08/920,561, filed on Aug. 29, 1997, now Pat. No. 6,111,416, which is a continuation of application No. 08/859,478, filed on May 20, 1997, now abandoned, which is a continuation-in-part of application No. 08/739,099, filed on Oct. 25, 1996, now Pat. No. 5,952,818.

(60) Provisional application No. 60/074,434, filed on Feb. 11, 1998, and provisional application No. 60/018,844, filed on May 31, 1996.

(51) Int. Cl.[7] .......................... G01R 31/00; G01R 33/02
(52) U.S. Cl. ....................................... 324/96; 324/244.1
(58) Field of Search ................................. 324/96, 244.1, 324/72, 76.19, 76.36, 637, 638, 639

(56) References Cited

U.S. PATENT DOCUMENTS

| 3,927,945 A | 12/1975 | Bates ........................... 356/106 |
| 4,070,621 A | 1/1978 | Bassen et al. ................. 324/96 |
| 4,355,869 A | 10/1982 | Yao .............................. 350/358 |
| 4,595,876 A | 6/1986 | Kuhara et al. ................ 324/96 |
| 4,618,819 A | 10/1986 | Mourou et al. ................ 324/77 |
| 4,742,577 A | * 5/1988 | Valdmanis ............... 324/76.36 |
| 4,873,485 A | 10/1989 | Williamson .................... 324/96 |
| 4,891,581 A | 1/1990 | Takiguchi ..................... 324/96 |
| 4,910,458 A | 3/1990 | Forsyth et al. ............... 324/158 |
| 4,928,058 A | 5/1990 | Williamson .................... 324/96 |
| 5,006,789 A | 4/1991 | Williamson .................... 324/96 |
| 5,134,361 A | 7/1992 | Pillow ........................... 324/96 |
| 5,406,194 A | 4/1995 | Dykaar et al. ................ 324/96 |
| 5,459,394 A | * 10/1995 | De Kort et al. ............. 324/750 |
| 5,635,831 A | 6/1997 | Englund ....................... 324/96 |
| 5,717,401 A | 2/1998 | Sabet-Peyman et al. ..... 342/192 |
| 5,991,036 A | * 11/1999 | Frankel ..................... 324/244.1 |
| 6,414,473 B1 | 2/2002 | Zhang et al. .................. 324/96 |
| 5,642,194 A1 | 6/2002 | Erskine ....................... 356/345 |

OTHER PUBLICATIONS

Jiang and X.–C. Zhang, "Electro–optic measurement of THz field with chirped optical beam", American Institute of Physics, Applied Physics Letters, vol. 72, No. 16, (Apr. 20, 1998), pp. 1945–1947.

F. G. Sun and Zhiping Jiang, "Analysis of teraherz pulse measurement with a chirped probe beam" 1998 American Instute of Physics, Applied Physics Letters, vol. 73, No. 16, (Oct. 19, 1998), pp. 2233–2235.

(List continued on next page.)

Primary Examiner—Michael Sherry
Assistant Examiner—Russell M. Kobert
(74) Attorney, Agent, or Firm—Heslin Rothenberg Farley & Mesiti P.C.

(57) ABSTRACT

Characterization of free-space electromagnetic energy pulses (15) using a chirped optical probe beam is provided. An electro-optic or magneto-optic crystal (14) is positioned such that the free-space radiation and chirped optical probe signal co-propagate, preferably in a co-linear common direction, through the crystal where a temporal waveform of the free-space radiation is linearly encoded onto a wavelength spectrum of the chirped optical probe signal. The temporal waveform of the free-space radiation is then reconstructed using, for example, a dynamic subtraction of the spectral distribution of the chirped optical probe signal without modulation from the spectral distribution of the chirped optical probe signal with modulation by the free-space radiation.

7 Claims, 20 Drawing Sheets

OTHER PUBLICATIONS

Z. Jiang, X.–C. Zhang, "A Single Far–Infrared (FIR) Pulse", Physics Today (Optics Lett. 23, 1114, 1998), (Aug. 1998).

Brian H. Kolner and David M. Bloom, "Electrooptic Sampling in GaAs Integrated Circuits", IEEE Journal of Quantum Electronics, vol. QE–22, No. 1, (Jan. 1986), pp. 79–93).

Janis A. Valdmanis and G. Mourou, "Subpicosecond Electrooptic Sampling: Principles and Applications", EII Journal of Quantum Electronics, vol. QE–22, No. 1 (Jan. 1986), pp. 69–78.

Q. Wu and X.–C. Zhang, "Free–space electro–optic sampling of terahertz beams", Appl. Phys. Lett. 67 (24), 1995 American Institute of Physics, (Dec. 11, 1995), pp. 3523–3525.

Ajay Nahata, David H. Auston and Tony F. Heinz; Chengjiu Wu, "Coherent detection of freely propagating terahertz radiation by electro–optic sampling", Appl. Phys. Lett. 68 (2), 1996 American Institute of Physics, (Jan. 8, 1996), pp. 150–152.

Jepsen et al., "Detection of THz pulses by phase retardation in lithium tantalate", Physics Review E, The American Physical Society, vol. 53, No. 4 Apr. 1996), pp. R3052–R3054.

A. Galvanauskas et al., "Real–time picosecond electro–optic oscilloscope technique using a tunable semiconductor laser", App. Phy. Lett. 60(2), 1992 American Institute of Physics, (Jan. 13, 1992), pp. 145–147.

P. Y. Han et al., "Ultrafast electro–optic sensors and magneto–optic sensors for THz beams", Proceedings of SPIE Repring, SPIE –The International Society for Optical Engineering, vol. 3277, (Jan. 28–29, 1998), pp. 198–207.

P. R. Smith et al., "Subpicosecond Photoconducting Dipole Antennas", IEEE Journal of Quantum Electronics, vol. 24, No. 2, (Feb. 1988), pp. 255–260.

Fattinger et al, "Terahertz beams", Appl. Phys. Lett. 54 (6), 1989 American Institute of Physics, (Feb. 6, 1989), pp. 490–492.

Q. Wu et al., "7 terahertz broadband GaP electro–optic sensor", Appl. Phys. Lett. 70(14),1997 American Institute of Physics, (Apr. 7, 1997) pp. 1784–1786.

Jepsen et al., "Detection of high power THz pulses bphase retardation in an electro–optic crystal", International Symposium on Ultra–Fast Processes in Spectroscopy, Trieste, Italy, Oct. 30–Nov. 3, 1995, pp. 1–7.

Hu et al., "Imaging with Terahertz Waves, " Optic Letters, vol. 20, No. 16, pp. 1716–1719, Aug. 1995.

A. Laurin Publication Biophotonics, "Bell Labs' 'T–rays' Provide Unique Images With a Variety of Potential Applications," Biophotonics International, pp. 58–59; Jul./Aug. 1995.

Nahata et al., "Coherent Detection of Freely Propagating Terhertz Radiation by Electro–Optic Sampling," Appl. Phys. Lett. vol. 68, No. 2, pp. 150–152, Jan. 1996.

Noss, Martin C., "Chemistry is Right for T–Ray Imaging," IEEE Circuits and Devices, pp. 25–29, Mar. 1996.

Wu, Q. et al., "Free–space electro–optic sampling of mid––infrared pulses" Appl, Phys. Lett. vol. 71, No. 10, pp. 1285–1286.

The Modulation of Optical Radiation, Chapters 14.3 –14.4, pp. 338–343 (publication date unavailable).

Valdmanis, J. A., "High–Speed Optical Electronics: The Picosecond Optical Oscilloscope" Solid State Tech. Test & Measur. World, pp. S40–S44 (missing S41, S43) (Nov. 1986).

Born and Wolf, Principles of Optics 6th Ed., Pergamon Press, 1980, pp. 752–753. (Month Unavailable).

Jiang and Zhang, "Single–shot spatiotemporal terahertz field imaging" Optical Letters, vol. 23, No. 4, Jul. 15, 1998, pp. 1114–1116.

Jiang and Zhang, "Measurement of Spatio–Temporal Terahertz Field Distribution by using Chirped Pulse Technology", IEEE Journal of Quantum Electronics, vol.36, No. 10, Oct. 2000, pp. 1214–1222.

Valdmanis "Real–Time Picosecond Optical Oscilloscope", Proceedings of the Fifth OSA Topical Meeting, Snowmass, Colorado, Jun. 16–19, 1986, pp. 02–05.

Riordan et al., "THz Beam Sensors", OSA TOPS, vol. 18, Radiative Process and Dephasing in Semiconductors, 1998 Optical Society of America, (May3–8, 1998), pp. 108–116.

* cited by examiner

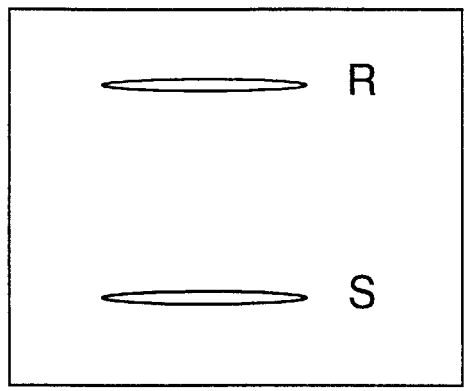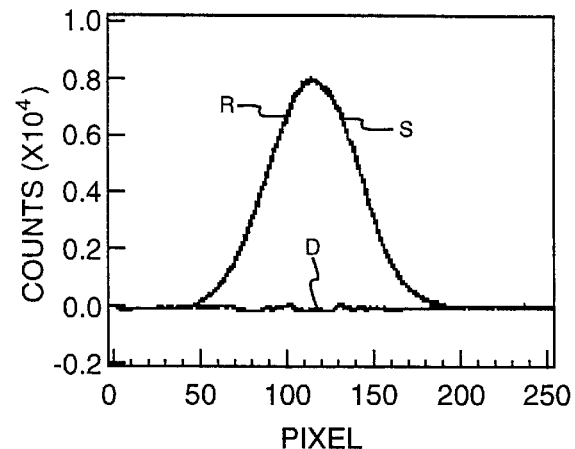
fig. 11A    fig. 11B
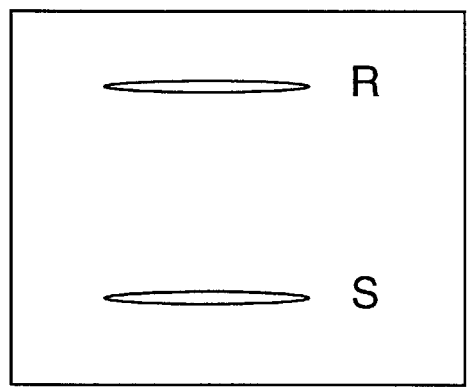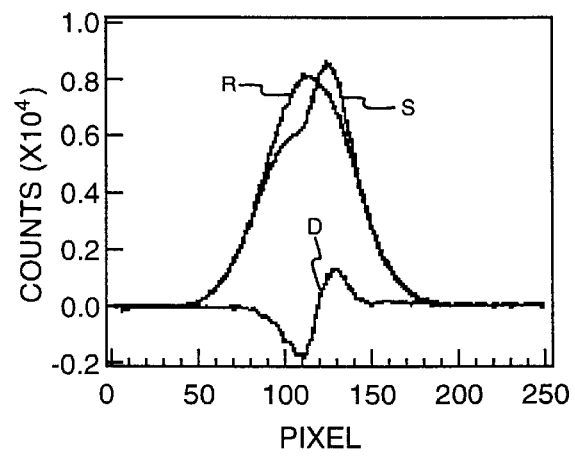
fig. 11C    fig. 11D

METHOD OF CHARACTERIZING FREE-SPACE RADIATION USING A CHIRPED OPTICAL PULSE

CROSS-REFERENCE TO RELATED APPLICATIONS

This application is a divisional application of application Ser. No. 09/617,242 filed on Jul. 14, 2000, now U.S. Pat. No. 6,414,473, which is a continuation of Patent Cooperation Treaty Application PCT/US99/02922, filed Feb. 10, 1999, which claims the benefit of U.S. Provisional Application No. 60/074,434, filed Feb. 11, 1998. Application 09/617,242 now U.S. Pat. No. 6,414,473, is also a continuation-in-part of U.S. application Ser. No. 08/920,561, filed Aug. 29, 1997, and issued as U.S. Pat. No. 6,111,416 on Aug. 29, 2000, which was a continuation of U.S. application Ser. No. 08/859,478, filed May 20, 1997, now abandoned, which was a continuation-in-part of U.S. application Ser. No. 08/739,099, filed Oct. 25,1996, and issued as U.S. Pat. No. 5,952,818 on Sep. 14, 1999, which itself comprised a regular U.S. application claiming the benefit of U.S. Provisional Application No. 60/018,844, filed May 31, 1996. All of these applications are hereby incorporated by reference herein in their entirety.

STATEMENT AS TO RIGHTS UNDER FEDERALLY-SPONSORED RESEARCH

This invention was made with Government support under Contract No. DMD19-99-1-0333 awarded by the United States Army Research Office. Accordingly, the U.S. Government has certain rights in this invention.

TECHNICAL FIELD

The present invention relates to characterizing free-space electromagnetic radiation using electro-optic or magneto-optic crystal sampling, and more particularly, to electro-optic or magneto-optic measurement of a spatial-temporal distribution of free-space pulsed radiation using a chirped optical pulse.

BACKGROUND OF THE INVENTION

Electro-optic sampling is a powerful technique for the characterization of a repetitive electrical waveform, such as an electrical signal in an integrated circuit (see Kolner et al., IEEE J. Quantum Electron., Q.E.-22, p. 69 (1986), and Valdmanis et al., IEEE J. Quantum Electron., Q.E.-22, p. 79 (1986)), or a terahertz beam in a free-space environment (see United States applications by Zhang et al., entitled "Electro-Optical Sensing Apparatus and Method for Characterizing Free-Space Electro-Magnetic Radiation," Ser. No. 08/739,099 and "Electro-Optical and Magneto-Optical Sensing Apparatus and Method for Characterizing Free-Space Electro-Magnetic Radiation," Ser. No. 08/902,561, now U.S. Pat. No. 6,111,416, both of which are hereby incorporated herein by reference).

Conventional time domain electro-optic sampling is based on the repetitive property of the signal to be tested. A sequential plot of the signal versus time delay reassembles the temporal form. Unfortunately, if the signal to be measured is from a single-event experiment, such as an explosion or transitory breakdown, this technique is clearly not suitable.

Time-domain optical measurements, such as the terahertz time-domain spectroscopy in pump/probe geometry of the above-incorporated United States Patent Applications, use a mechanical translation stage to vary the optical path between the pump and the probe pulses. The intensity or polarization of the optical probe beam, which carries information generated by the pump beam, is repetitively recorded for each sequential time delay. In general, this data acquisition for the temporal scanning measurement is a serial acquisition; i.e., the signal is recorded during the probe/pulse sampling through a very small part of the terahertz waveform (roughly the pulse duration of the optical probe beam). Therefore, the data acquisition rate in this single channel detection approach is limited to less than 100 Hz for a temporal scan on the order of tens of picoseconds. Clearly, this relatively low acquisition rate cannot meet the requirement for real-time measurements, such as time-domain terahertz spectroscopy, of fast-moving objects or flame analysis.

Thus, there exists a need in the art for an enhanced technique for measurement of a terahertz spatial-temporal distribution, and particularly for one which is suitable for real-time imaging applications using free-space radiation.

DISCLOSURE OF THE INVENTION

Briefly summarized, in one aspect a sensor for characterizing free-space radiation is presented. The sensor includes one of an electro-optic crystal or a magneto-optic crystal positionable so that the free-space radiation passes therethrough. Means are provided for generating a chirped optical probe signal and for co-propagating the chirped optical probe signal through the crystal with the free-space radiation such that a temporal waveform of the free-space radiation is encoded onto a frequency spectrum of the chirped optical probe signal. The sensor also includes means for decoding a characteristic of the free-space radiation using the chirped optical probe beam with the temporal waveform of the free-space radiation encoded on its frequency spectrum.

In another aspect, an imaging system for imaging an object is provided. The imaging system includes means for generating a free-space electromagnetic radiation pulse positionable to pass through the object to be imaged, and one of an electro-optic crystal or a magneto-optic crystal positioned so that the electromagnetic radiation pulse passes through the crystal after passing through the object. The system further includes means for generating a chirped optical probe signal to impinge the crystal simultaneous with the electromagnetic radiation pulse passing therethrough so that a temporal waveform of the radiation is encoded onto a wavelength spectrum of the chirped optical probe signal. The chirped optical probe signal modulated by the free-space radiation is then passed to decoding means for decoding a characteristic of the free-space electromagnetic radiation using the chirped optical probe signal with the temporal waveform of the radiation encoded thereon. The system further includes means for determining a characteristic of the object using the characterization of the free-space electromagnetic radiation pulse after passing through the object.

In a further aspect, a method is provided for characterizing free-space radiation. The method includes: providing one of an electro-optic crystal or a magneto-optic crystal positionable so that the free-space radiation passes therethrough; generating a chirped optical probe signal and co-propagating the chirped optical probe signal through the crystal with the free-space radiation so that a temporal waveform of the free-space radiation is encoded onto a wavelength spectrum of the chirped optical probe signal; and decoding a characteristic of the free-space radiation using the chirped optical probe signal with the temporal waveform of the free-space radiation encoded on its wavelength spectrum.

To restate, presented herein is a measurement technique employing a chirped optical probe beam which allows characterization of a free-space electromagnetic pulse. When the chirped optical probe beam and radiation pulse co-propagate in an electro-optic or magneto-optic crystal, different portions of the radiation pulse, through Pockels effect, modulate different wavelength components of the chirped pulse. The resultant modulated spectral distribution can then be decoded by taking the difference between the modulated spectrum and the spectral distribution of the chirped optical probe without the radiation modulation. The measurement technique of this invention provides single-shot measurement ability and ultrafast measuring speed. With these advantages, the technique can be employed with a number of possible applications, including monitoring for transient emitter breakdown, measuring unsynchronized a microwave, spatial-temporal imaging of non-terahertz signals, monitoring various unsynchronized fast phenomenon, such as chemical reactions and explosions, and studying non-linear effects. Various additional advantages will also be apparent to those skilled in the art based upon the embodiments of the invention presented hereinbelow.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which:

FIG. 11 is an example of the results of dynamic subtraction in accordance with the present invention wherein (A) comprises images of the CCD spectral traces without a terahertz signal, and (C) images of the CCD spectral traces with a terahertz signal, while (B) depicts the spectral plot without the terahertz signal and (D) is the spectral plot with the terahertz signal;

BEST MODE FOR CARRYING OUT THE INVENTION

With the introduction of a chirped optical probe beam into an electro-optic or magneto-optic sampling apparatus as described in the above-incorporated applications, it is possible to perform free-space electromagnetic pulse measurement. By using a linearly chirped optical probe pulse in free-space electro-optic measurements, a temporal waveform of a co-propagating terahertz field is linearly encoded onto the frequency spectrum of the optical probe pulse, and then decoded by dispersing the probe beam from a grating to a detector array. Note that as used herein, "electro-optic" is intended to encompass either electro-optic measurements or magneto-optic measurements as described in the above-incorporated applications using either an electro-optic crystal or a magneto-optic crystal, respectively.

Figure 1:
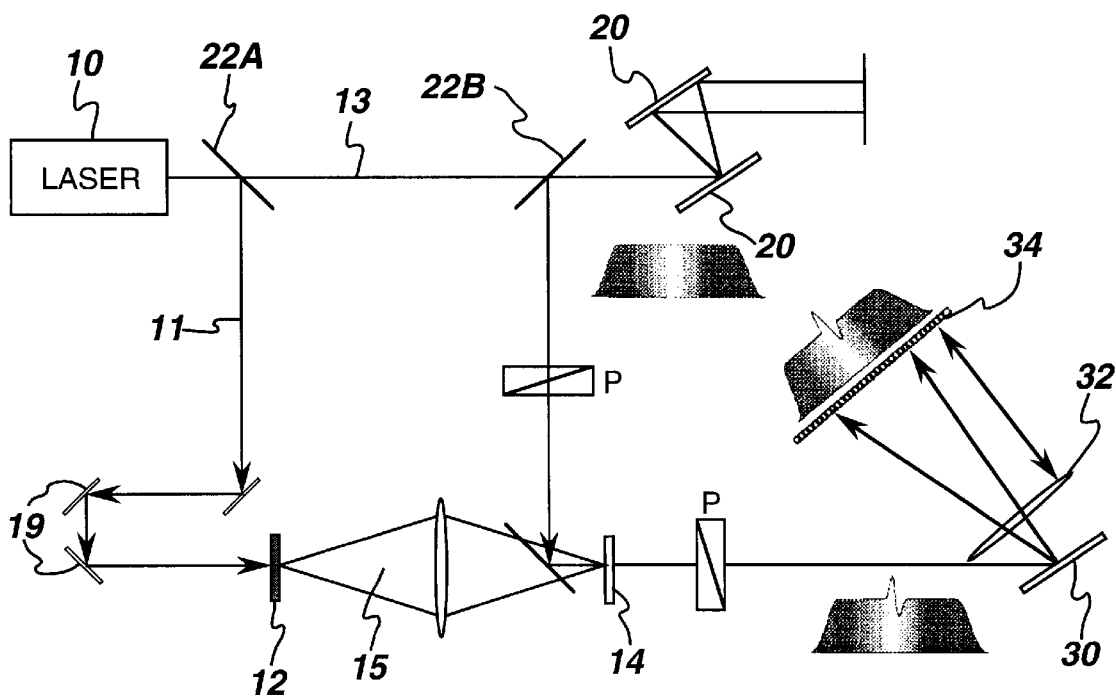
FIG. 1 is a schematic of one embodiment of electro-optic measurement of a free-space radiation pulse using a chirped optical probe signal in accordance with the principles of the present invention.

The measuring principle can be understood with reference to FIG. 1. A femtosecond laser beam is split into pump and probe beams 11 & 13, respectively. The geometry is similar to the conventional free-space electro-optic sampling setup described in the above-incorporated applications, except for the use of a grating pair 20 for chirping and stretching the optical probe beam 13, and a grating-lens combination 30 & 32 with a detector array 34 for the measurement of the spectral distribution. The pump beam 11, generated by an ultra short laser 10, is used to generate the terahertz beam 15 from an emitter 12. The terahertz beam is focused onto, for example, electro-optic crystal 14 by a polylens 16. The fixed delay-line 19 is only used for the positioning of the THz pulse, within the duration of the synchronized probe pulse, (acquisition window) and for temporal calibration. Note that although discussed herein with reference to a terahertz pulse, those skilled in the art will understand that the concepts presented are equally applicable to other electromagnetic radiation beams and that a terahertz pulse is only one example.

The probe beam is frequency chirped and temporally stretched by grating pair 20 by passing beam 13 through beam splitters 22a & 22b to grating 20 for reflection off mirror 21. The linearly chirped pulse is equivalent to a series of sub-pulses that have different wavelengths and are temporally delayed. Due to the negative chirp of the grating (pulse with decreasing frequency versus time), the blue component of the pulse leads the red component.

The chirped probe signal is returned from grating pair 20 to the reflective surface of beam splitter 22b after which the signal is passed through a first polarizer to generate a purely linearly polarized probe beam. This linearly polarized beam is modulated inside the electro-optic crystal, and becomes slightly elliptical due to phase modulation. A second polarizer P is used to convert the phase modulation into an intensity modulation. This second polarizer has a polarization axis that is perpendicular to the polarization axis of the first polarizer.

When the chirped probe beam and a THz pulse co-propagate in the electro-optic crystal, different portions of the THz pulse, through Pockels effect, modulate the different wavelength components of the chirped pulse. Therefore, the THz waveform is encoded onto the wavelength spectrum of the probe beam. A spectrometer, e.g., comprising grating 30 and lens 32 combination, and a detector array (LDA or CCD) 34 are used to measure the spectral distribution. As explained further below, the temporal THz signal can be extracted by measuring the difference between the spectral distributions of the probe pulse with and without THz pulse modulation applied via the electro-optic crystal 14.

We can also prove mathematically that the measured signal is proportional to the THz field under certain conditions. Assuming that the unchirped probe be is a diffraction limited Gaussian pulse with a central frequency $\omega_0$ and an envelope Gaussian function:

$$f_0(t) = \exp\left(-\frac{t^2}{T_0^2} - i\omega_0 t\right), \tag{1}$$

where $T_0$ is the pulse duration, which is related to the laser spectral bandwidth $\Delta\omega_0$ through $T_0=2/\Delta\omega_0$. After diffraction by the grating pair, the electric field component of the chirped probe beam can be written in the form:

$$f_c(t) = \exp\left(-\frac{t^2}{T_c^2} - i\alpha t^2 - i\omega_0 t\right) \tag{2}$$

where $2\alpha$ is the chirp rate, and $T_c$, $\omega_0$ are the pulse duration and center frequency, respectively. When the chirped probe pulse co-propagates through the electro-optic (EO) crystal with a THz field of electric field $E(t-\tau)$, the transmitted probe pulse is given by $$f_m(t) = f_c(t)[1 + kE(t-\tau)] \tag{3}$$

where T is the time delay between the THz pulse and the probe pulse, and $|k|<<1$ is a constant. The value of k, which is related to the modulation depth, depends on many factors, such as the electro-optic coefficient, optical bias, scattering, thickness of the crystal, and the group velocity mismatch.

Since a spectrometer is used to disperse the probe beam, the spectral modulation is spatially separated on the CCD array. In that case, the measured signal on a CCD pixel with optical frequency $\omega_1$, is proportional to the convolution of the spectral function of the spectrometer and the square of the Fourier transform of the chirped pulse:

$$M(\omega_1) \propto \int_{-\infty}^{+\infty} g(\omega_1 - \omega) \left| \int_{-\infty}^{+\infty} f_m(t) \exp(i\omega t) dt \right|^2 d\omega \tag{4}$$

where $g(\omega_1-\omega)$ is the spectral function of the spectrometer. By using Equation (3), Equation (4) can be written as:

$$M(\omega_1) \propto \int_{-\infty}^{+\infty} g(\omega_1 - \omega) \times \tag{5}$$

$$\left| \int_{-\infty}^{+\infty} \exp\left(-\frac{t^2}{T_c^2} - i\alpha t^2 - i(\omega_0 - \omega)t\right)[1 + kE(t-\tau)]dt \right|^2 d\omega$$

The integral in Equation (5) can be evaluated by using the method of stationary phase if a is sufficiently large (see M. Born and E. Wolf *Principles of Optics*, 6th ed. Pergamon, N.Y., p. 752 (1980)). Since $T_c$ and the THz pulse duration are much longer than the oscillation period of the optical beam ($2\pi/\omega_0$), the factor $\exp(-t^2/T_c^2)[1+kE(t-\tau)]$ is a slowly varying function of time. The phase factor in Equation (5) gives a self-canceling oscillation, so as to allow the contribution of the integrand to be neglected everywhere except in the vicinity of certain critical points. At the critical point the derivation of the Equation (5) with respect to "t" is zero. In this case it gives:

$$t_\omega = \frac{\omega_0 - \omega}{2\alpha}. \tag{6}$$

Defining a normalized differential intensity:

$$N(\omega_1) = \frac{M(\omega_1)|_{THzon} - M(\omega_1)|_{THzoff}}{M(\omega_1)|_{THzoff}}, \tag{7}$$

It can be proved that $N(\omega_1)$ is proportional to the input THz field under certain approximations. Since $|k|<<1$ is true for typical electro-optic measurements, by taking the first order of k, and applying Equation (6), we have:

$$N(\omega_1) = \frac{\int_{-\infty}^{+\infty} g(\omega_1 - \omega) 2kE(t_\omega - \tau)\exp(-2t_\omega^2/T_c^2)d\omega}{\int_{-\infty}^{+\infty} g(\omega_1 - \omega)\exp(-2t_\omega^2/T_c^2)d\omega}. \quad (8)$$

When the spectral resolution is so high that the spectral function of spectrometer can be expressed as a δ function, we will have $$N(\omega_1) \propto 2kE(t_{\omega_1} - \tau). \quad (9)$$

This equation shows that the measured spectral profile is indeed proportional to the temporal profile with respect to the input of the THz waveform when the chirp rate is sufficiently large and the resolution of the spectrometer is sufficiently high. The validity and the influence of these conditions is discussed in the following sections.

I. Experimental Setup

This section gives certain experimental details of one embodiment. In this embodiment, the laser is an amplified Ti:sapphire laser (Coherent Rega 9000) with an average power of 0.9 W and a pulse duration of 200 fs at 250 kHz. The center wavelength of the Ti:sapphire laser is about 820 nm with a spectrum bandwidth of 7 nm. The THz emitter is an 8-mm wide GaAs photoconductor with the bias voltage ranging from 2 kV to 5 kV. The focal lens for the THz beam is a polythelene lens with 5 cm focal length. A 4 mm thick <110> ZnTe crystal is used.

The optical probe pulse is frequency chirped and time stretched by a grating pair, and the time window can be easily changed by changing the grating distance. This distance is several centimeters corresponding to the time window of tens of picoseconds. For electro-optic modulation, two polarizers are used with perpendicular polarization in order to get the highest modulation depth induced by the THz field. The detailed analysis will be given further below. The dispersion element is a spectrometer (Instrument SA, SPEX 500M) with spectral resolution of 0.05 nm, and dispersion of 1.6 mm/nm. The detector array is a CCD camera (Princeton Instruments, Inc., CCD-1242E). This CCD camera has 1152×1242 pixels and a full well capacity greater than 500,000 electrons, dynamic range 18 bits, and minimum exposure time 5 ms. The data would be transferred to a computer (not shown) for further processing.

II. Experimental Results

Experimental results are presented below for three cases: single point measurement, spatio-temporal imaging and dynamic subtraction.

1. Single Point Measurement

Figure 2:
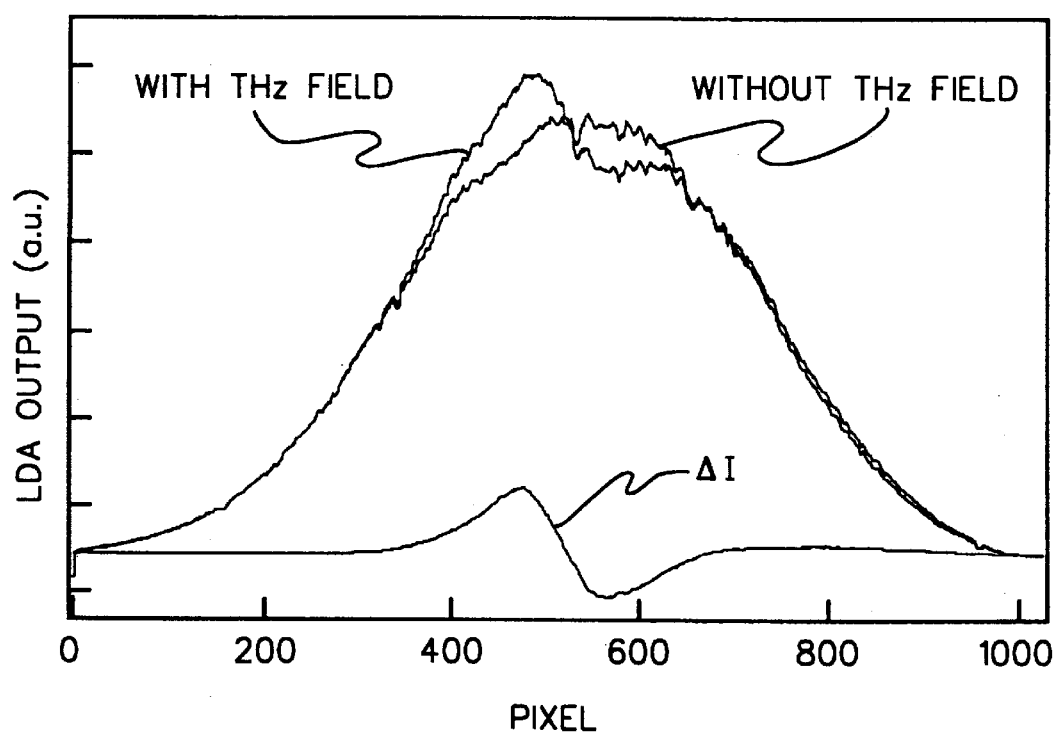
FIG. 2 graphically depicts spectral distribution of a chirped optical probe pulse with and without a co-propagating terahertz field pulse in accordance with the present invention.

In this case, the chirped probe beam is focused onto the EO crystal, and hence the THz waveform of a single point is measured. FIG. 2 shows the spectral distributions of the chirped probe pulse with and without THz modulation and the differential spectrum distribution (ΔI). This differential distribution reconstructs both the amplitude and phase of the temporal waveform of the THz pulse. The differential spectrum (ΔI) in FIG. 2 shifts horizontally by adjusting the fixed delay line. Moving the fixed delay line is equivalent to placing the terahertz field in a different portion of the probe beam spectrum and it can be used as a marker to calibrate the time scale.

Figure 3:
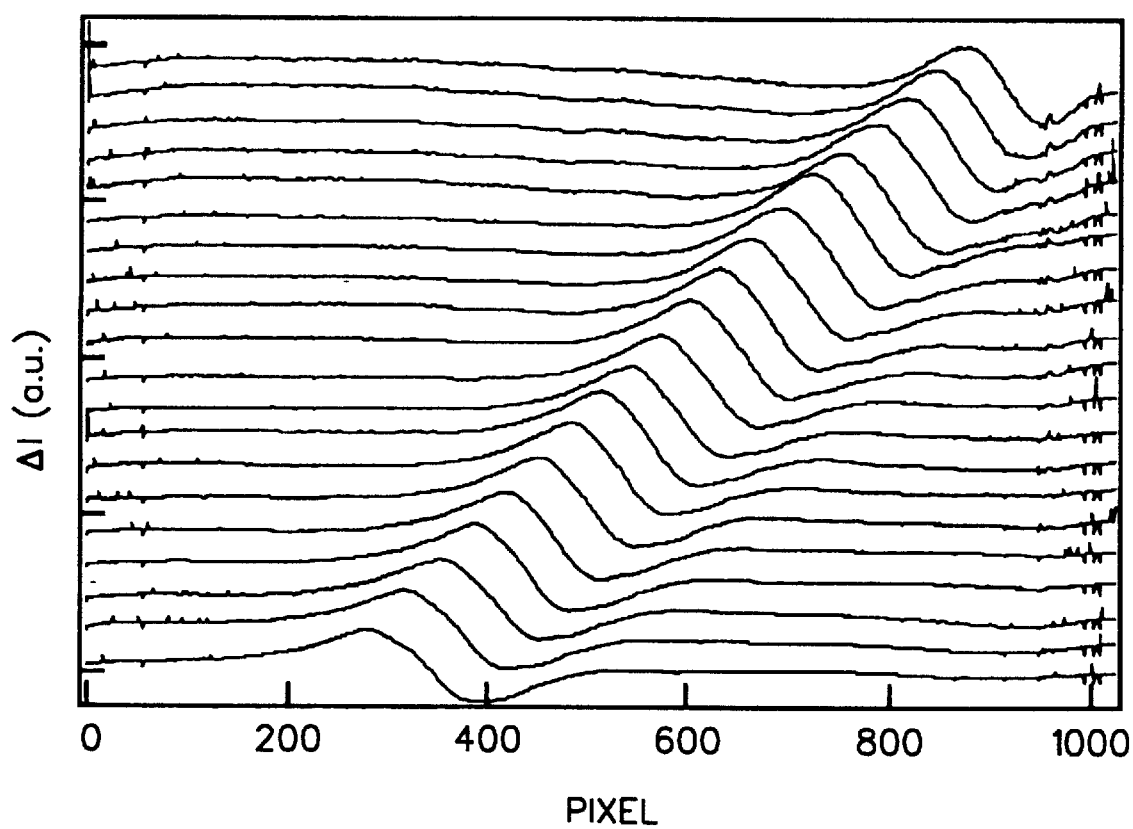
FIG. 3 depicts a normalized differential spectral distribution ($\Delta I/I$) by adjusting the fixed delay line of FIG. 1 at a step of 1.3 ps.

FIG. 3 shows the normalized differential spectrum distribution (ΔI/I) when adjusting the fixed time delay line at a step of 1.3 ps. The offset of the spectrum is shifted for better display. The noise at the edge pixels comes from the spectrum normalization with a small background. These waveforms shift linearly with the fixed time delay step. The total spectral window (1024 pixels) is equivalent to 44 ps, corresponding to 43 fs/pixel.

Figure 4:
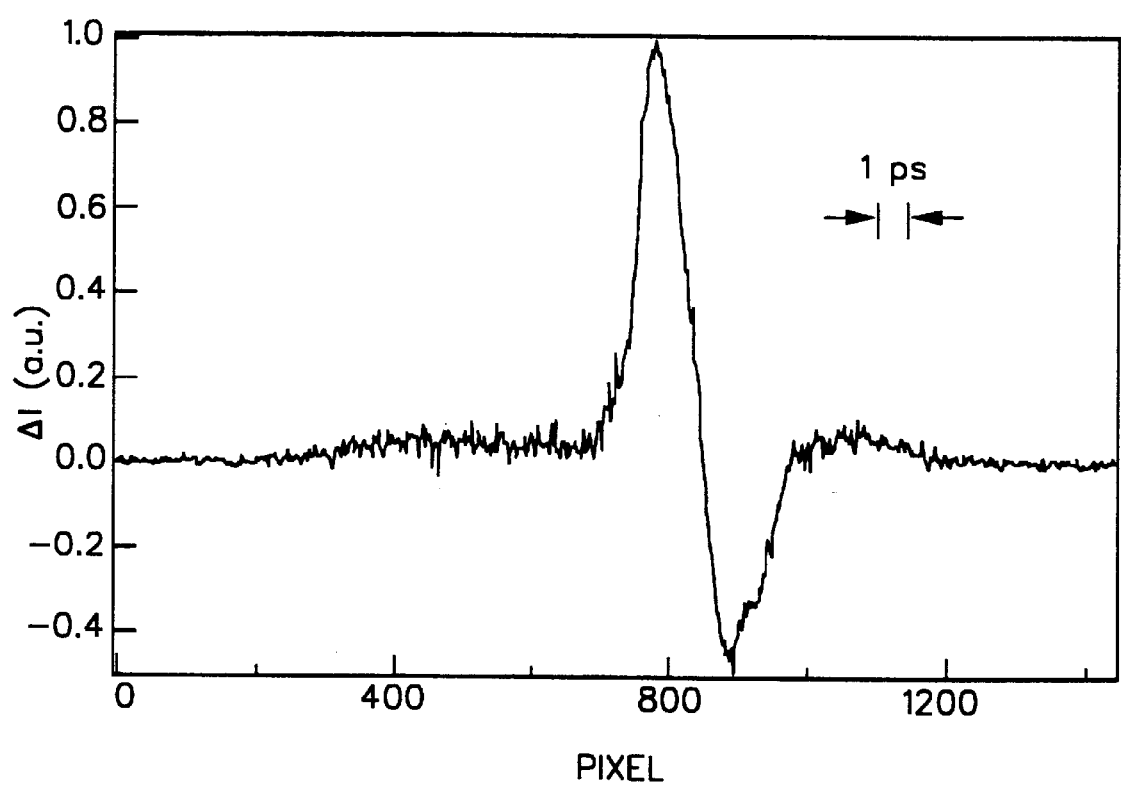
FIG. 4 is a graph of a single-shot spectral waveform of a terahertz pulse measured by a chirped optical probe pulse in accordance with the present invention, wherein the temporal waveform of the terahertz pulse is reconstructed.

The results shown in FIGS. 2 & 3 are obtained with a single CCD exposure, but with thousands of laser pulses. However unlike the conventional sampling techniques, where only a small portion of the entire THz waveform is measured at each time, for this chirped pulse measurement technique in accordance with the present invention, each pulse contains all the information of the entire THz pulse, and therefore single-shot measurement is possible. FIG. 4 depicts single-shot measurement of a THz pulse, with a signal-to-noise ratio (SNR) better than 60:1. In this experiment, we took a single-shot spectrum without the THz field, saved it as the background, then took a single-shot spectrum with the THz field and performed a subtraction of the background. Although this is not real single-shot in the sense that we need to take the reference spectrum, the real single-shot experiment can be done with dynamic subtraction, which is described below in part 3 of this section.

2. Spatio-Temporal Imaging

Figure 5:
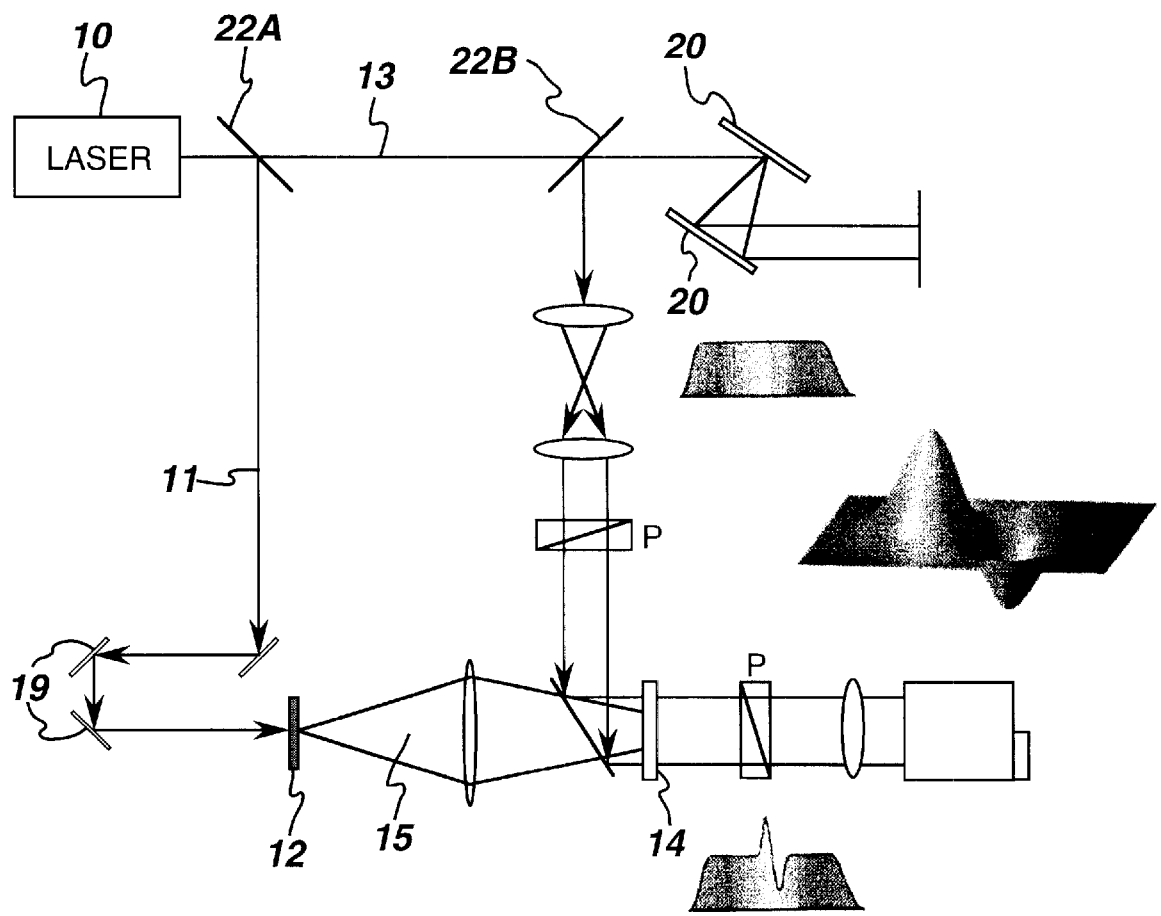
FIG. 5 is a diagram of one embodiment for spatio-temporal terahertz imaging in accordance with the principles of the present invention.

With slight modification of FIG. 1, it is possible to get 1D spatial information of the THz field. As shown in the sensor setup of FIG. 5, the probe beam 99 is focused to a line onto the EO crystal 100 by cylindrical lens 101, the imaging of this line is formed at the entrance plane of the spectrometer 110, therefore one-dimensional spatial and one-dimensional temporal information of the THz field 102 is measured simultaneously.

Figure 6:
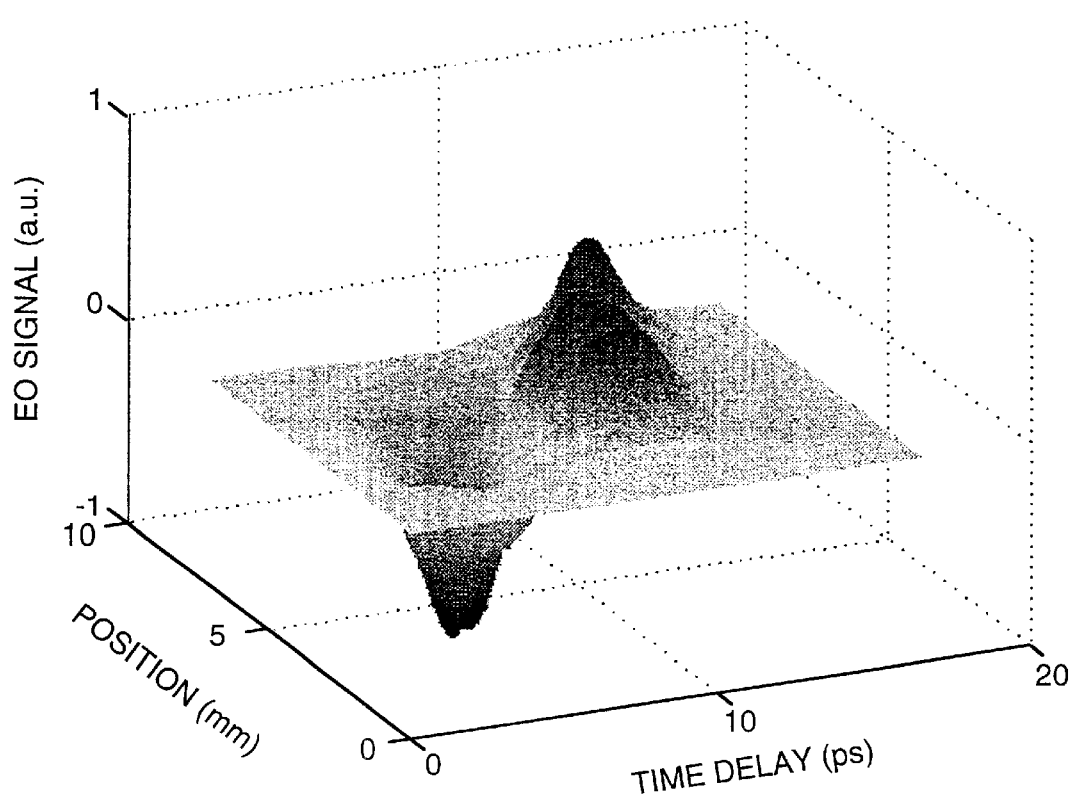
FIG. 6 is a graph depicting one dimensional terahertz imaging of a dipole in accordance with the principles of the present invention.
Figure 7:
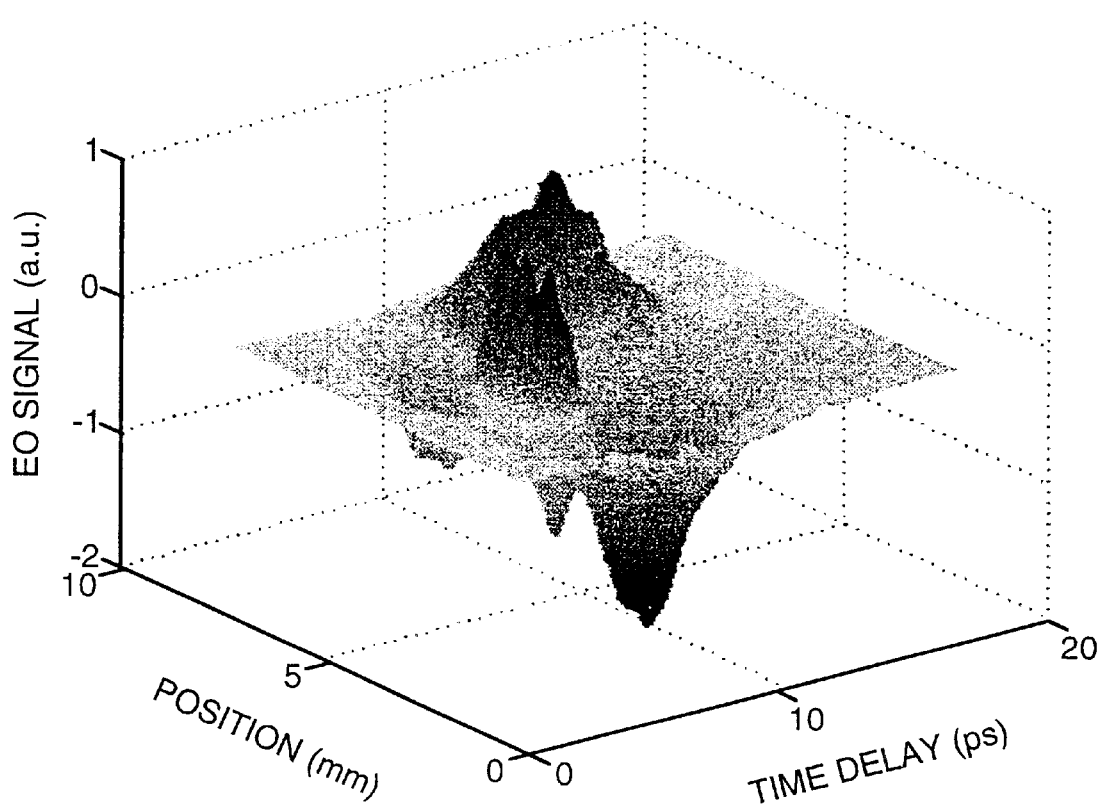
FIG. 7 is a graph depicting one dimensional terahertz imaging of a quadrupole in accordance with the principles of the present invention.

The experimental procedure is the same as for single point measurement; that is, the background spectrum is taken and saved as the reference with the THz signal off, and then the other spectrum is measured with the THz signal on, the difference giving the THz signal. FIGS. 6 and 7 show the measured distribution images of THz fields (x position versus time) emitted from dipole and quadrupole emitters, respectively. The measured spatial resolution in the imaging system is better than 1 mm, which is close to diffraction limited resolution in other unchirped THz techniques.

Figure 8:
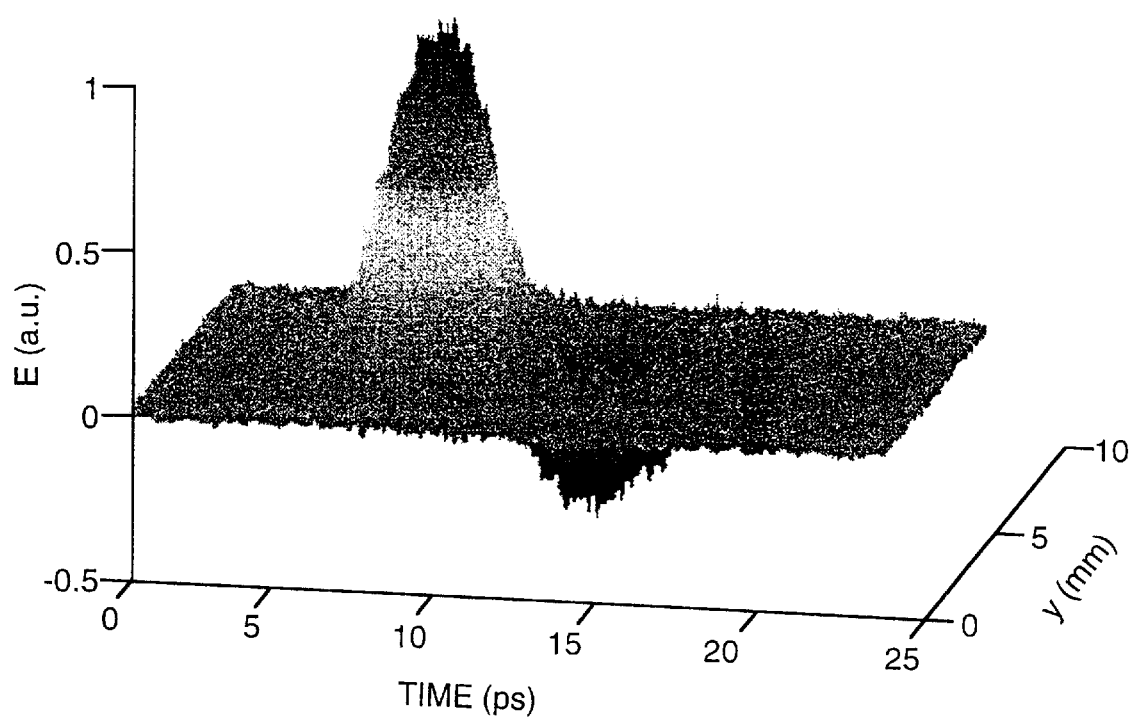
FIG. 8 is a graph depicting single-shot one dimensional terahertz imaging of a dipole field without signal averaging, wherein the y-axis corresponds to the spatial position across the dipole emitter.

FIG. 8 is a plot of a single-shot image from a GaAs photoconductive dipole antenna. This plot contains original data without signal averaging and smoothing. The total time for wavelength division multiplexing and demultiplexing is a few picoseconds. The dipole length is 7 mm, and the bias voltage is 5kV. One-dimensional spatial distribution across the dipole and its temporal THz waveform are obtained simultaneously in a single laser pulse. The size of the spatio-temporal image is 10 mm by 25 ps. In this single-shot measurement the background light per pixel on the CCD camera is ~200 counts, whereas that of the modulated probe pulse is ~50. Typical oscillation features and the symmetric spatial distribution of the far-field pattern from a dipole photoconductive emitter are obtained.

Figure 9:
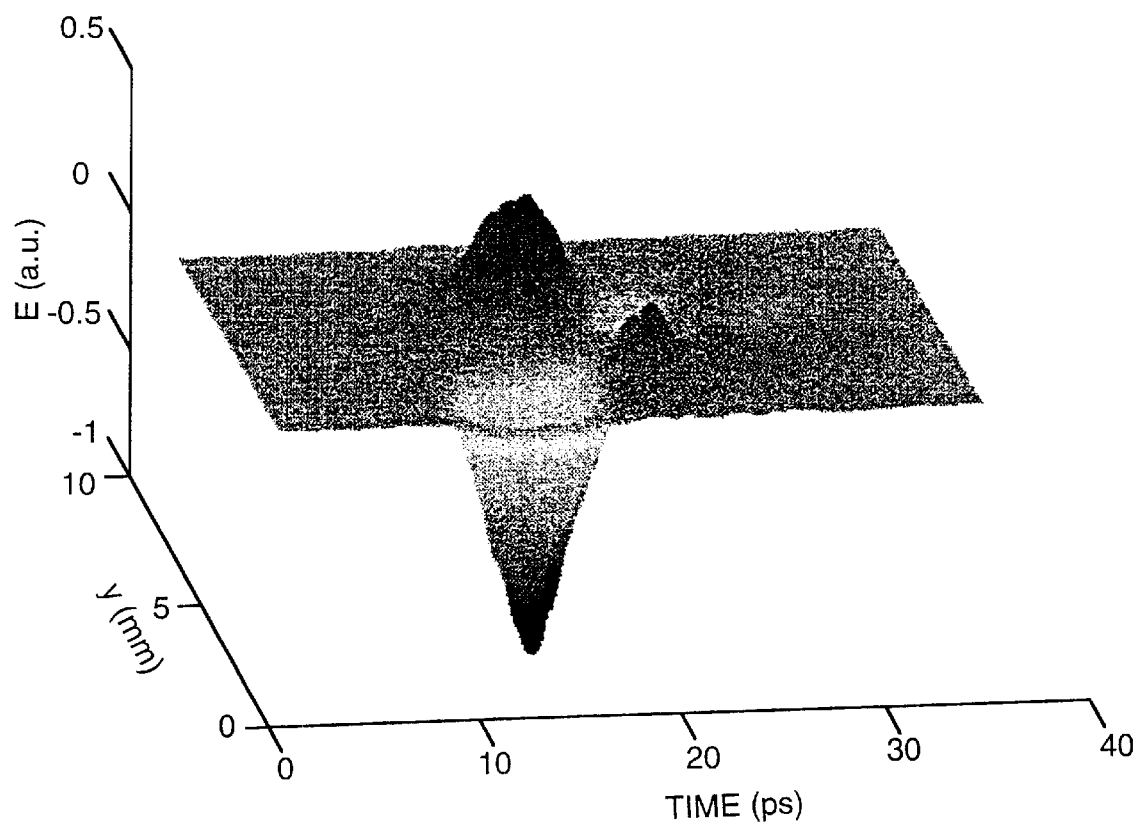
FIG. 9 is a graph depicting one dimensional terahertz imaging of a quadrupole field, wherein the y-axis corresponds to the spatial position across the quadrupole emitter.

FIG. 9 shows a spatio-temporal image of the THz field from a quadrupole antenna. The size of the spatio-temporal image is 10 mm by 40 ps. The quadrupole has three parallel electrodes separated by 3 mm. The center electrode is biased and the two adjacent electrodes are grounded. The field pattern from two back-to-back dipoles shows opposite polarity depending on the spatial position (y axis). Temporal oscillation from each dipole can be resolved individually. The layered structure in the y-axis direction is due to the optical inhomogeneity of the sensor crystal. A defect point in the ZnTe crystal causes an offset in the field strength of the temporal waveform (E axis in the figure). A high-quality ZnTe crystal with good spatial homogeneity will provide better spatial resolution.

3. Real Single-Shot Measurement (Dynamic Subtraction)

Figure 10:
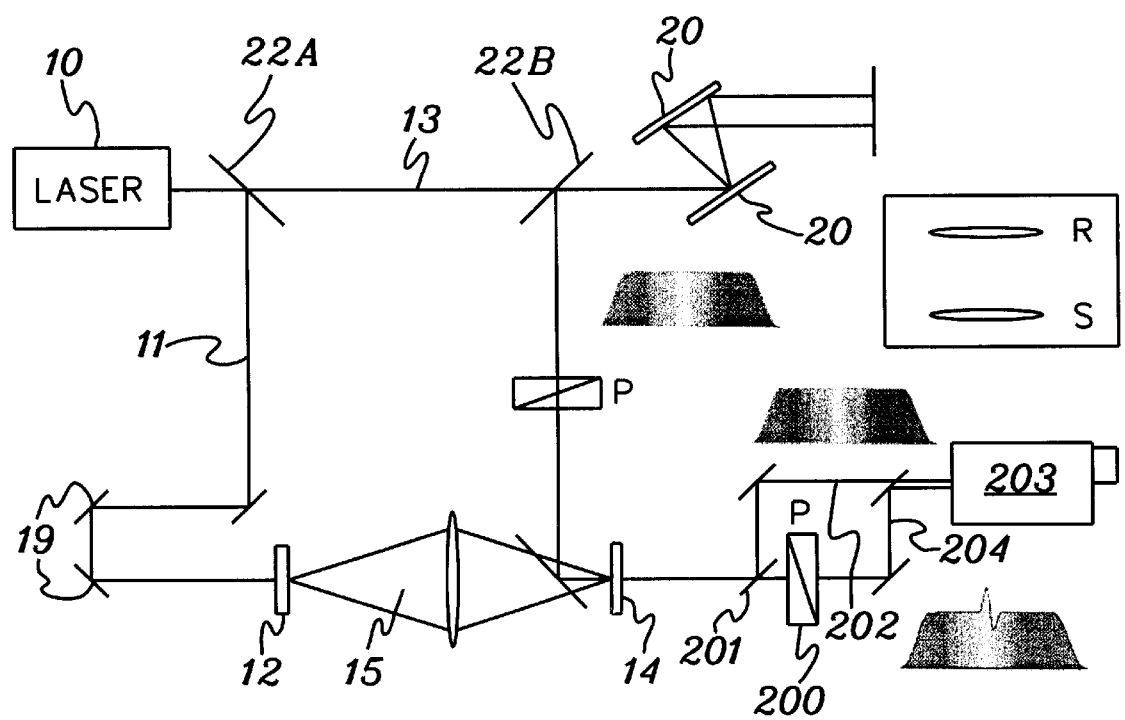
FIG. 10 is a diagram of dynamic subtraction in accordance with the present invention wherein the signal beam (S) and the reference beam (R) are sent to the spectrometer simultaneously.

As mentioned before, to retrieve the THz signal, we need two CCD exposures, one without THz modulation and one with THz modulation. However, since a 2D CCD camera is used, it is very easy to measure the spectra without and with THz modulation at the same time using different CCD locations. FIG. 10 shows the setup. Before the second polarizer 200, a beam splitter 201 is used to pick up part of the beam, this beam 202 is used as a real-time reference (R) and sent to the spectrometer 203 simultaneously with the signal beam (S) 204.

Figure 20:
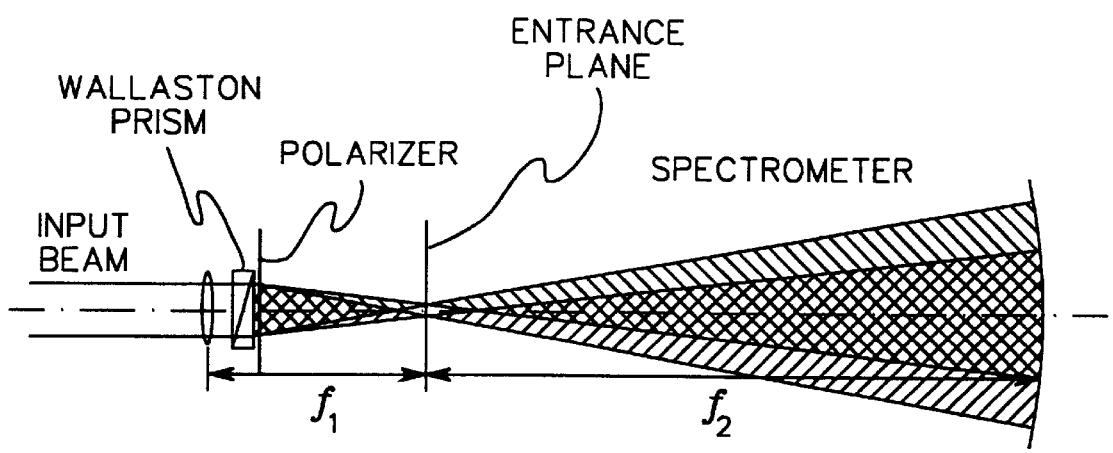
FIG. 20 is a schematic of one embodiment of compact optics employed in accordance with the principles of the present invention for dynamic subtraction used in chirped pulse measurement as described herein, wherein the angle separation of the Wallaston prism is about 3°.

FIG. 20 is an example of the input coupling of a spectrometer showing how to create two beams from one input beam with a lateral displacement at the entrance plane. A Wallaston prism is an ideal component to split one beam into two beams. The input beam is the polarized probe beam which is modulated by, for example, a terahertz electric field via Pockels effect inside the electro-optic crystal. The Wallaston prism is preferably set so that the polarization of one output beam (e.g., P1) is perpendicular to that of the input beam, while the polarization of another beam (e.g., P2) is parallel to that of the input beam. The intensity of beam P1 is much weaker than that of beam P2 due to a much better extinction; however, its modulation by the terahertz signal is much stronger. Therefore, beam P1 is the signal beam, and beam P2 can be taken as the reference beam.

Further, the intensity of beam P2 will need to be decreased to the same level as beam P1. However, an attenuator cannot be used because the two beams are not separated spatially. (They are separated at the entrance plane, but the separation is small and it is impractical to use an attenuator there.) Instead, a polarizer can be used. The polarization of this polarizer is nearly crossed with that of beam P2, therefore beam P2 is greatly decreased, while beam P1 is nearly unchanged. By rotating the polarizer, approximately the same intensities can be obtained between beam P1 and beam P2. This setup can ease the optical adjustment significantly. It is also possible to realize dynamic subtraction in 1D spatial and 1D temporal terahertz imaging.

This dynamic subtraction realizes real single-shot measurement, and improves signal-to-noise ratio because the signal spectrum and the reference spectrum are from the same laser pulse, therefore the laser fluctuation is mostly canceled. FIG. 11 depicts single-shot experimental results. The left panel is the images of the CCD spectral traces of the signal (S) and reference (R) beam, the right panel is the plots of these spectra. When there is no THz pulse, the signal and the reference spectra have good overlap, indicating that the reference is good. When the THz pulse is on, its modulation on the signal spectrum is obviously visible in the CCD image picture.

This dynamic subtraction is demonstrated only for a single point measurement, it is also possible for the spatio-temporal imaging, because only part of the CCD is used in the above imaging, however it is more difficult to align the optics.

III. Analysis

1. Temporal Resolution

As described above, when the chirp rate is sufficiently large and the spectral resolution of the spectrometer is sufficiently high, the measured signal is proportional to the THz field. However, the chirp rate is limited by the laser pulse bandwidth or the pulse duration. This limited chirp rate constrains the temporal resolution. To find the chirp rate and the spectral resolution dependence of the temporal resolution, we studied the output waveform distortion for a given input THz waveform. Assuming a bipolar THz waveform which has the form:

$$E(t) = -\frac{t}{\Delta T}\exp\left(-\frac{t^2}{\Delta T^2}\right), \tag{10}$$

here we define a characteristic time $\sqrt{2}\Delta T$ which is the interval between the maximum and minimum. The spectral function of spectrometer can be approximated by a Guassian function:

$$g(\omega_1 - \omega) = \exp\left(-\frac{(\omega_1 - \omega)^2}{\Delta\omega_s^2}\right), \tag{11}$$

where $\Delta\omega_s$ is the spectral resolution of the spectrometer. By putting Equations (10) and (11) into Equation (7), it can be shown that the normalized differential intensity function can be written as:

$$N(\tilde{t}) \propto \frac{1}{(1+\gamma^2)^{3/4}}\tilde{t}\exp\left\{-\frac{\tilde{t}^2}{1+\delta^2+\gamma^2}\right\}, \tag{12}$$

where the dimensionless time is defined by:

$$\tilde{t} = \frac{t_{\omega_1}}{\Delta T}, \text{ and} \tag{13}$$

$$\delta = \frac{\Delta\omega_s}{2\alpha\Delta T}, \gamma = \frac{\beta}{\alpha}, \beta = \frac{1}{T_c^2} + \frac{1}{\Delta T^2}. \tag{14}$$

So the measured normalized differential intensity function $N(\tilde{t})$ in Equation (12) is similar to the bipolar THz field in Equation (10), except that the characteristic time increases by a factor of $\sqrt{1+\delta^2+\gamma^2}$. As $\alpha$ increases, and $\delta$ and $\gamma$ decrease, the distortion decreases. Therefore, the larger the chirp rate, the better the temporal resolution.

For a given chip rate, the temporal resolution $T_{min}$ is defined when the input pulse is so narrow that the broadening factor is equal to $\sqrt{2}$. In the experiment, the measuring window ($T_c$) should be much bigger than the THz time scale ($\Delta T$), (i.e. $T_c^2 >> \Delta T^2$, $\beta \approx 1/\Delta T^2$), therefore we have:

$$\frac{1}{T_{min}^2} = \alpha\left[\sqrt{1+\left(\frac{\Delta\omega_s^2}{8\alpha}\right)^2} - \frac{\Delta\omega_s^2}{8\alpha}\right]. \tag{15}$$

If the spectral resolution of the spectrometer is about $\Delta\lambda=0.05$ nm, or equivalently $\Delta\omega_s=0.15$ THz and $\alpha=0.18$ THz$^2$, then we have $\Delta\omega_s^2/8\alpha<<1$. Therefore, $1/T_{min}^2=\alpha$ is a very good approximation for equation (15). With the time domain and frequency domain expression of the chirped probe beam it is easy to prove that:

$$\alpha \approx 1/T_0T_c. \tag{16}$$

Combining $1/T_{min}^2=\alpha$ and $\alpha \equiv 1/T_0T_c$, we have:

$$T_{min}=\sqrt{T_0T_c}. \tag{17}$$

Therefore, if the laser pulse is diffraction-limited with a simple Gaussian profile, the temporal resolution is equal to the square root of the product of the original probe beam duration and the chirped pulse duration. The physics can be understood in the following way: since the THz pulse within the duration of the synchronized probe pulse window (acquisition window) only modulates a portion of the probe pulse spectrum, the limited frequency bandwidth in the modulated spectrum cannot support the required temporal resolution. If the pulse duration of the chirped probe beam $T_c$, is comparable to the duration of the THz waveform, then the temporal resolution will be $T_{min}=\sqrt{T_0 T_{THZ}}$. Compared with the sampling method by varying the optical path, the temporal resolution decreases by a factor of $\sqrt{T_{THZ}/T_0}$. For example, assuming an original probe beam duration of 0.05 ps and a chirped pulse duration of 20 ps, the estimated limit of the temporal resolution is 1 ps.

Figure 12:
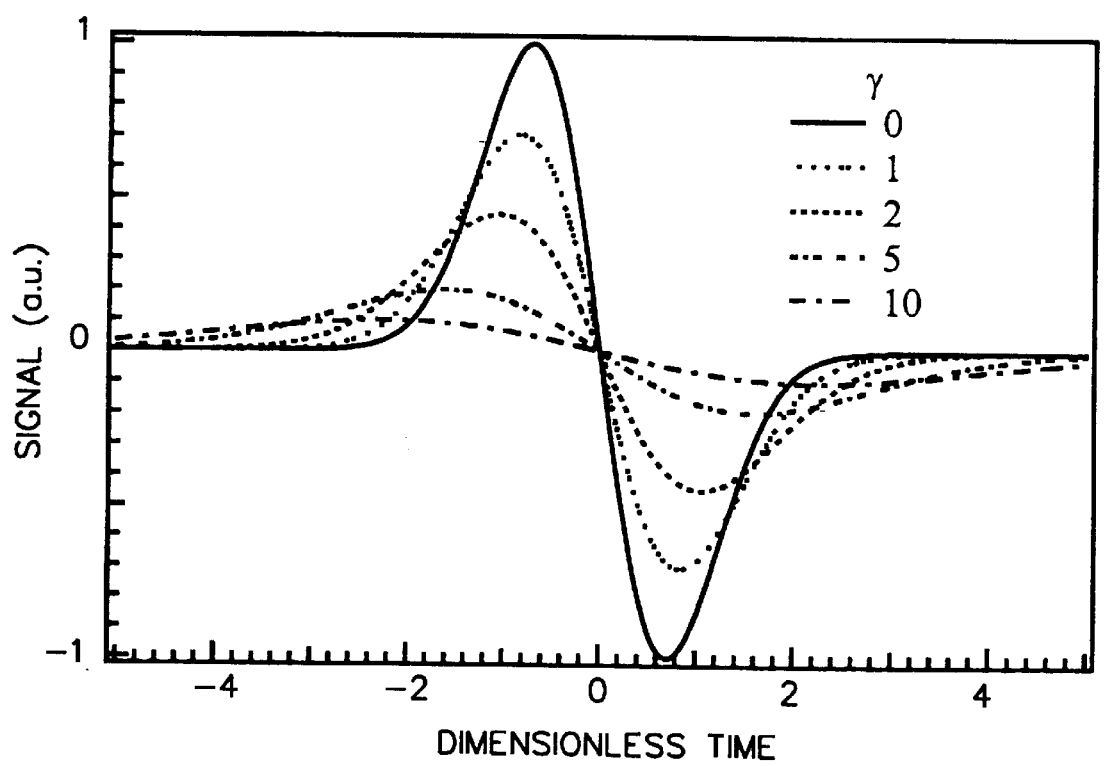
FIG. 12 graphically depicts simulated output results for measurement of a bipolar input terahertz waveform in accordance with the present invention.

The simulated distortion of the THz waveform with several different chirp rates is shown in FIG. 12. In this simulation we assume that $\Delta\omega_s=0$ and focus on the chirp rate dependence of temporal resolution. The x axis is dimensionless time $\tilde{t}$ as defined in Equation (13), and the y axis is the relative signal. The solid curve ($\gamma=0$ for $\alpha \to \infty$) is the original waveform without distortion. The larger the $\alpha$, the smaller the $\gamma$, and the smaller the distortion will be. It is seen that the distortion is determined by the quantity $\gamma$ which is a combination of the chirp rate and the pulse duration ($\gamma=1/\alpha\Delta T^2$). In order to improve the temporal resolution, $T_c$ or $T_0$ must be reduced. The smallest $T_0$ is determined by the measurable time window, which should be larger than the THz duration. Therefore, a shorter original probe pulse (or equivalently broader spectrum) is more desirable. In principle, a wider bandwidth can support a shorter pulse duration. A white-continuum probe pulse with a higher chirp rate should provide better temporal resolution.

2. Working Point Selection for Electro-Optic Modulation

As mentioned above, the THz signal is extracted by subtracting the probe spectra with and without THz modulation. To obtain a good signal, a large modulation depth is essential, that is why two crossed polarizers (zero optical bias) are used instead of the balance detection geometry (Linear optical bias) as in most experiments. Ideally, if the EO crystal is perfect, i.e. there is no scattering and no birefringence, then the system works at real zero optical bias, the extinction ratio should only be limited by that of the polarizers, the system response is not linear but quadratic, and the modulation depth is always close to 1. However, it has been found that the insertion of the EO crystal reduces the extinction ratio dramatically, and the system response is nearly linear in most cases. Most importantly this phenomenon limits the achievable modulation depth.

Experimentally we can use a birefringence compensator to increase the extinction ratio, indicating that residue birefringence is one reason. However, the compensator can not eliminate the background light completely, this suggests possible scattering light within ZnTe crystal which has a random phase. This scattering light also contributes to the background light. By including the contribution from both the strain-induced birefringence and the scattering effects, the transmitted light I in the FIG. 1 geometry can be described by a modified equation $$I=I_0[\eta+\sin^2(\Gamma_0+\Gamma)], \quad (18)$$

where $I_0$ is the input light intensity, $\eta$ the contribution by the scattering, $\Gamma_0$ the optical bias induced by the residue birefringence of the ZnTe crystal plus the intrinsic birefringence of the compensator, and $\Gamma$ the electric field induced birefringence contribution. Note that Equation (18) is slightly different than the common notation (see Amnon Yariv "Opto-Electronics" 4th ed., Oxford University Press, p. 328 (1991)). For simplicity, we add $\eta$ to include the scattering contribution, and the optical phase terms $\Gamma_0$, $\Gamma$ are twice their counterparts in the above-reference Yariv publication. We define the modulation depth as:

$$\Delta \equiv \frac{I_{\Gamma\neq 0} - I_{\Gamma=0}}{I_{\Gamma\neq 0} + I_{\Gamma=0}}. \quad (19)$$

Because $\Gamma_0$ is much smaller than 1, we have $$\Delta \approx \frac{2\Gamma_0\Gamma + \Gamma^2}{2\eta + \Gamma_0^2 + (\Gamma_0 + \Gamma)^2}. \quad (20)$$

Figure 13:
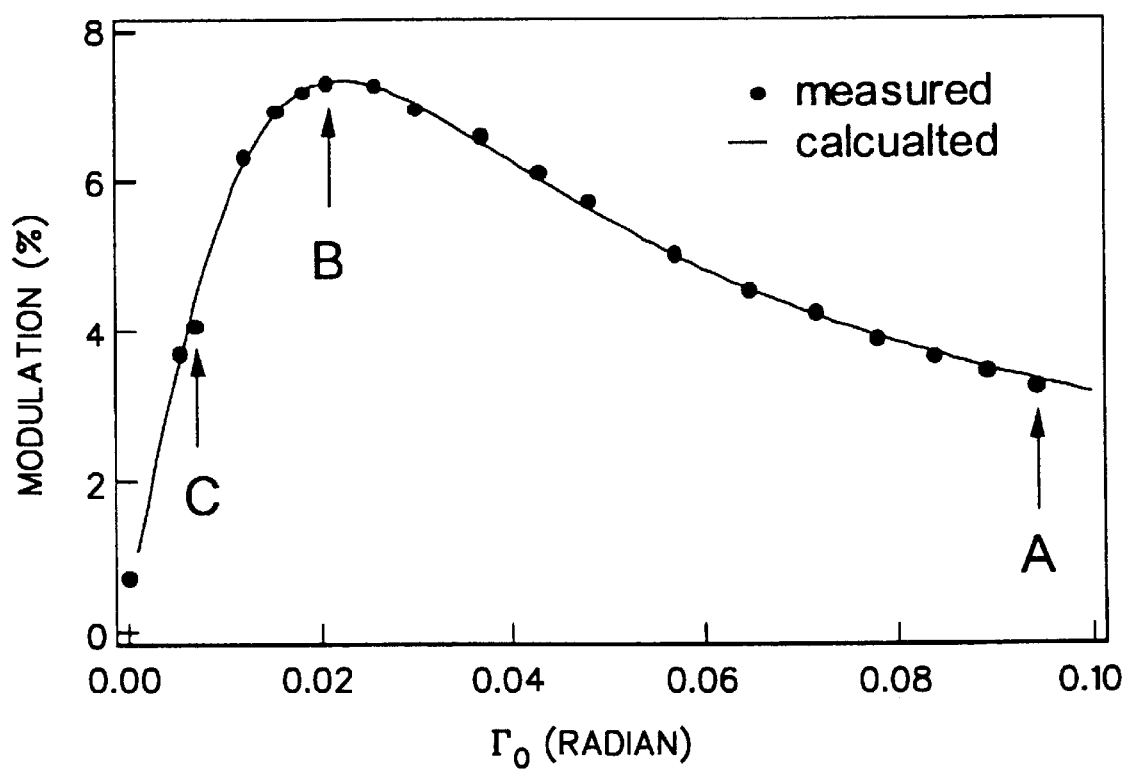
FIG. 13 graphically depicts measured and calculated modulation depth versus optical bias $\Gamma_0$ employing a sensor in accordance with the present invention.

We experimentally measured the modulation depth $\Delta$ versus optical bias $\Gamma_0$, the result is shown in FIG. 13, wherein the dots are the experimental data while the solid curve is calculated by Equation (20). The excellent agreement between the experiment and the theoretical calculation proves the model Equation (18).

It is seen that there exists a maximum modulation depth when $\Gamma_0$ is given by the root of the equation $\partial\Delta/\partial\Gamma_0=0_1$ $$\Gamma_0^m = -\frac{\Gamma}{2} \pm \sqrt{\left(\frac{\Gamma}{2}\right)^2 + \eta} \approx \pm\sqrt{\eta} \text{ and} \quad (21)$$

$$\Delta_{max} \approx \frac{\Gamma}{2\sqrt{\eta}}. \quad (22)$$

Putting Equation (21) into Equation (18), the transmitted light at the maximum modulation depth point is $$I \approx 2\eta I_0. \quad (23)$$

Experimentally, it is easy to find the maximum modulation depth point, when the THz pulse is off, we can adjust the compensator to obtain minimum transmitted light, which equals $\eta I_0$ according to Equation (18), then double the transmitted light by rotating the compensator, this is roughly the best working point.

3. Sensitivity

In this part, we estimate the minimum measurable electric field. A 4 mm thick <110> ZnTe is used as an example. If E is the THz electric field, then the THz pulse induced birefringence $\Gamma$ is $$\Gamma = \frac{\pi d n^3 \gamma_{41}}{\lambda}E, \quad (24)$$

where d is the crystal thickness, $\gamma_{41}$ is the electro-optic coefficient, and $\lambda$ is the wavelength of the probe beam. In Equation (24), the group velocity mismatch (GVM) is not considered, this is a good approximation because for a ZnTe crystal the influence of GVM is not significant. For ZnTe, $n^3\gamma_{41} \approx 108 \times 10^{-12}$ mV, and assume we use d=4.0 mm, $\lambda$=820 nm, therefore $$\Gamma \approx 1.65 \times 10^{-4} E, \quad (25)$$

the unit of E is V/cm.

Putting Eq. (25) into Eq. (22), and using the measured scattering parameter $\eta \approx 5.2 \times 10^{-4}$, the maximum modulation depth is $$\Delta_{max} \approx 3.64 \times 10^{-3} E. \quad (26)$$

The modulation depth should be bigger than the laser fluctuation which is on the order of 1%. In Eq. (26), when E=10 V/cm, $\Delta_{max} \approx 3.64\%$, this is roughly the minimum modulation depth and therefore electric field.

One should also note that the above modulation depth is in time-domain, the frequency domain modulation depth is smaller due to the limited temporal resolution, hence the practically measurable electric field is higher.

IV. Summary

The parallel sampling property of the chirped pulse measurement technique provides some unique features; including a single shot ability, and ultrafast measuring speed. With these advantages, the technique of the present invention can be used in the field where the conventional sampling techniques can not. Some possible applications follow.

1. Emitter Breakdown

If a biased THz emitter is working under high bias voltage, a strong laser pulse could lead to damage to the emitter. This is a single event, and conventional sampling techniques are obviously not suitable to identifying this breakdown. The chirped pulse technique is an ideal tool, and spatial as well as temporal information can be obtained simultaneously.

2. Unsynchronized Microwave

There have been some attempt to measure the microwave using the sampling techniques. In these measurements good synchronization between the probe laser and the microwave source is essential. However, with the single-shot ability of the chirped pulse techniques described herein, no synchronization is needed because the chirped probe pulse can catch a piece of the microwave waveform within a single pulse, therefore the jitter between the microwave and laser does not affect the result.

3. Spatio-temporal Imaging of non THz Signal

Although we did the chirped pulse measurement with THz, but this technique should not be limited in this area. It can be easily extended to other pump/probe experiments whenever the probe beam is modulated by the pump beam.

4. Other Unsynchronized Fast Phenomena

For a single point measurement, a linear CCD detector can be used. The frame rate of the linear CCD can go to several tens of kHz. In contrast, with conventional sampling techniques and a mechanical delay line, the obtainable number of waveforms is at most 100. Therefore, the chirped pulse technique can be used in fast changing phenomena, such as chemical reactions and explosions.

5. Nonlinear Effect

Generally the study of nonlinear effects requires very high laser power and often times the laser repetition rate is very low. In this situation, sampling with a mechanical delay line is either inconvenient or unfeasible. However, the chirped pulse technique presented herein is very suitable, because the signal is very strong, and the single shot measurement capability does not require a high repetition rate.

We have demonstrated THz measurement by using the chirped pulse technique, this novel technique allow us to acquire a THz signal at an extremely high data rate. Single-shot spatio-temporal imaging is now realized. The principle has been proved mathematically, and the analysis of the temporal resolution, including the optimal EO modulation point sensitivity analysis are given. We also proposed certain applications.

The electro-optic measurement using a chirped optical pulse can also be used to generate and detect broadband mid-infrared terahertz pulses. Further, real-time, two-dimensional terahertz wave imaging is possible. Finally, free-space magneto-optic sampling is also possible as initially discussed herein. Each of these aspects is discussed below.

Figure 14:
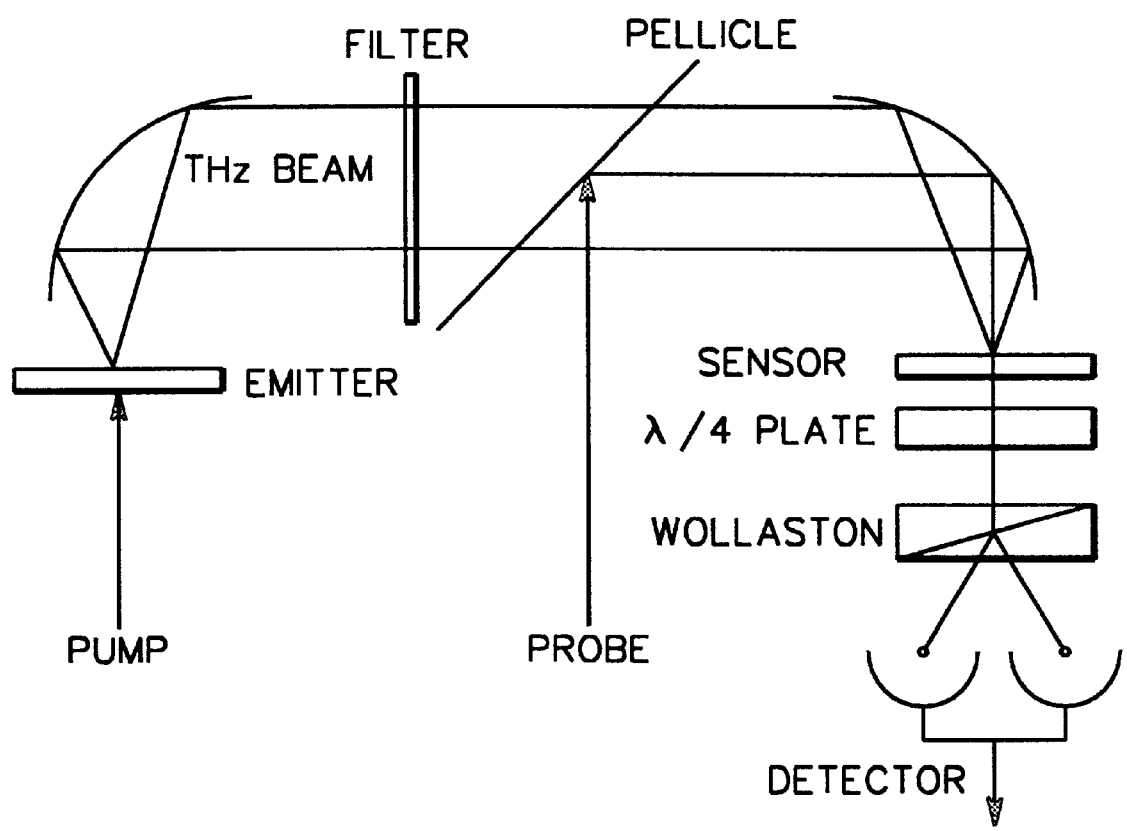
FIG. 14 is a schematic of one embodiment of an electro-optic measurement device for broadband mid-infrared spectroscopy in accordance with the present invention.

The experimental setup of the electro-optic mid-IR detection system is similar to the one used in the previous examples, and is shown in FIG. 14. A 12 fs Ti:sapphire laser delivers an average power of nearly 500 mW at a center wavelength of 800 nm. Several zincblende crystals (including GaAs, ZnTe, CdTe, InP, and GaP) with differing thickness were used as the emitters and sensors. We also tried LiTaO$_3$ and BBO as emitter materials. From LiTaO$_3$ we obtained a bandwidth extending to 43 THz. Three hundred and fifty milliwatts of the laser power was focused on the emitter by a gold-coated off-axis parabolic mirror with a 5-cm effective focal length. The broadband THz radiation generated from the emitter by optical rectification was collimated and then focused on the sensor by a pair of f/0.6 off-axis parabolic mirrors. The laser probe beam collinearly travels with the THz beam profile. If the emitter crystal is transparent to the optical excitation beam, such as ZnTe or GaP, a silicon wafer is placed after the emitter crystal to block the optical beam and transmit only the THz beam. The electro-optic modulation induced by the ultrafast Pockels effect can be detected using a pair of balanced photodiodes. By varying the time delay between the optical pump and probe pulses, the temporal waveform of the mid-infrared transient is sampled.

Experimental results of mid-infrared THz pulse measurements indicate that the thickness of the electro-optic crystals (both emitter and sensor) is significant, influencing the waveform of the measured THz pulse.

Electro-Optic THz Imaging

One significant application of free-space electro-optic sampling is THz imaging. By illuminating an electro-optic crystal with a THz beam and an optical readout beam, then detecting the optical beam with a linear diode array or CCD camera, time-resolved 1-D or 2-D images, respectively, of pulsed far-infrared radiation can be achieved. This system is capable of noninvasively imaging moving objects, turbulent flows, or explosions.

Figure 15:
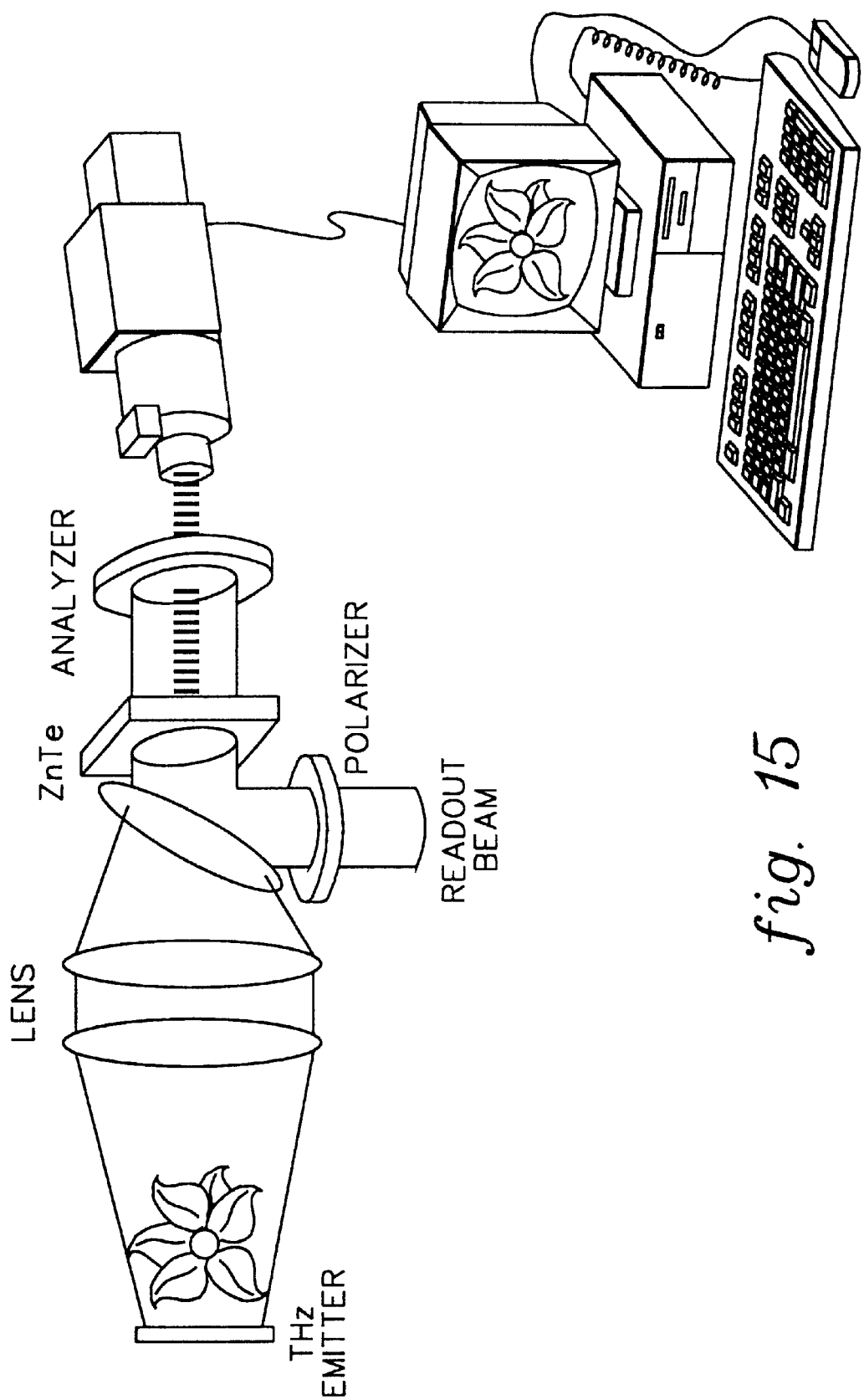
FIG. 15 is a schematic of one embodiment of an electro-optic measurement device in accordance with the principles of the present invention for conversion of a terahertz image into an optical image by converting a two-dimensional field distribution in the sensor crystal into a two-dimensional optical intensity distribution which is recorded by a digital CCD camera.

FIG. 15 schematically illustrates the experimental arrangement for free-space electro-optic THz imaging. Silicon lenses are used to focus the THz radiation on a <110> oriented ZnTe crystal. An optical readout beam with a diameter larger than that of the THz beam probes the electric field distribution within the crystal via the Pockels effect. The 2-D THz field distribution in the sensor crystal is converted into a 2-D optical intensity distribution after the readout beam passes through a crossed polarizer. A linear diode array or a digital CCD camera then records the optical image.

Magneto-Optic THz Sampling

Magnetic field detection methods vary widely. Hall effect magnetonomers and optical Kerr effect spectroscopies are quite common. The most sensitive device though, is the superconducting quantum interference device, or SQUID, with a magnetic field resolution of $10^{-14}$ Tesla. This far surpasses the detection capabilities of any other magnetic sensing device. The drawback to SQUID technology is the 2 MHz detection bandwidth, and cost. Photoconductive switches are the most efficient and cost effective method, thus far, for investigating a transient magnetic field. The free-space magneto-optic sampling technique discussed here is an extension of the photoconductive switch and the well-established electro-optic sampling technique. This magnetic technique offers the potential coherent measurement of transient magnetic fields, with a potential bandwidth spanning into the terahertz (THz) frequency range.

Figure 16:
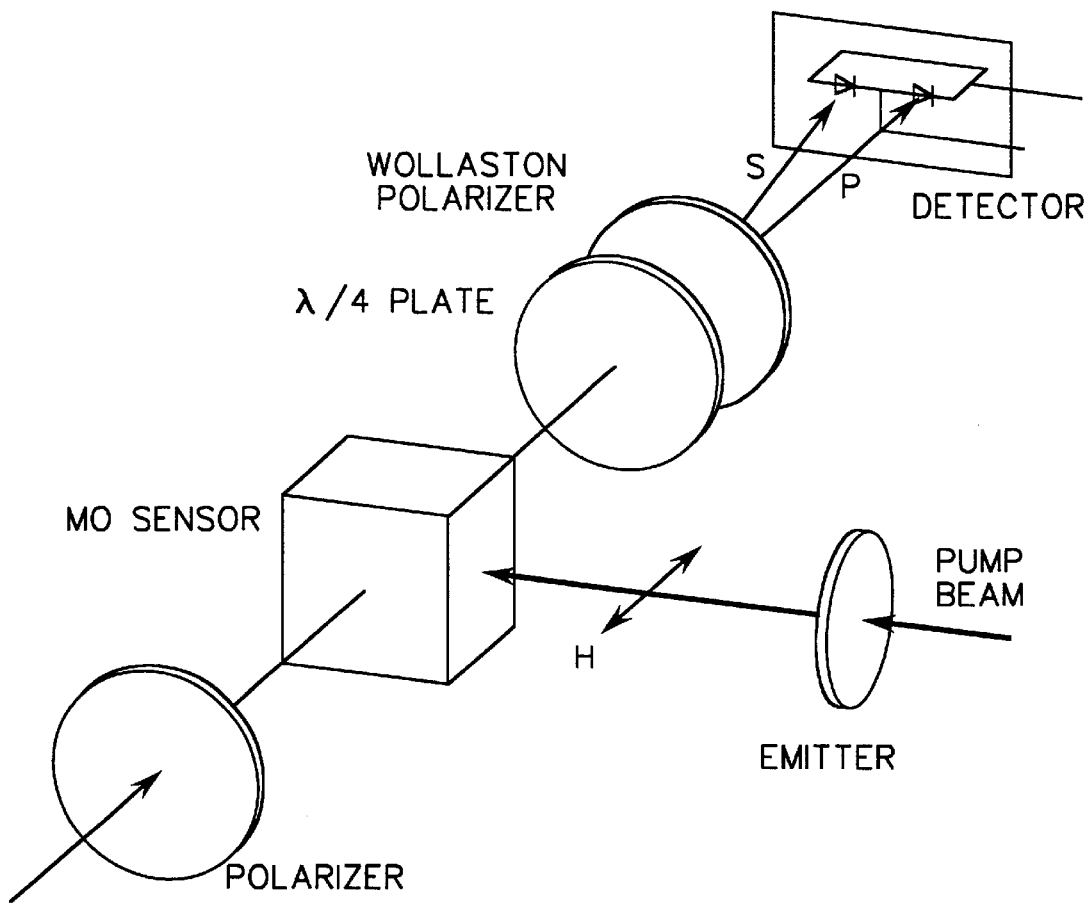
FIG. 16 is a schematic of one embodiment of a free-space magneto-optic sampling device in accordance with the present invention wherein the propagation direction of the probe beam is parallel to the direction of the magnetic component of the terahertz wave.

This experiment includes a regeneratively-amplified Ti:sapphire laser (Coherent RegA), producing 4 μJ pulses at a 250 kHz repetition rate, 200 fs pulse duration, and 800 nm wavelength. FIG. 16 illustrates the pump/probe arrangement. With the optical beam split by a 95/5 beam-splitter splitter, the two beams are recombined at the magneto-optic (MO) sensor. The stronger, time-delayed beam serves as the excitation beam for the THz field generation from a biased GaAs emitter. The weaker probe beam explores the induced Faraday rotation in the sensor crystal, produced by the collinear magnetic component of the THz radiation. With the introduction of the magnetic component of the THz wave, the index of refraction in the magneto-optic sensor is modulated via the Faraday effect. The measured temporal waveform is a time-dependent, intensity-modulated, index birefringence response by the MO sensor material. A pair of balanced photodiodes records this waveform through a lock-in amplifier connected to a computer.

The angle of polarization rotation of the probe beam has the form, $\theta(t)=VB(t)L\cos\gamma$, with V as the Verdet constant, B(t) as the magnitude of the magnetic field, L as the optical beam/THz wave interaction length in the crystal, and $\gamma$ as the angle between the direction of the magnetic field and that of the probe beam. Maximum rotation ($\gamma=0$) dictates collinear propagation of the probe beam and the magnetic component of the THz wave. This is accomplished by proper alignment of the biased THz emitter, and results in the orthogonal placement of the emitter relative the probe beam direction.

This free-space technique provides magnetic transient field detection extending to hundreds of gigahertz. The potential to obtain THz bandwidth response by proper geometry considerations is expected. Larger magnetic fields than the current $10^{-5}$ Tesla will improve the signal-to-noise ratio, while thinner sensors will provide the subpicosecond temporal response.

Figure 17:
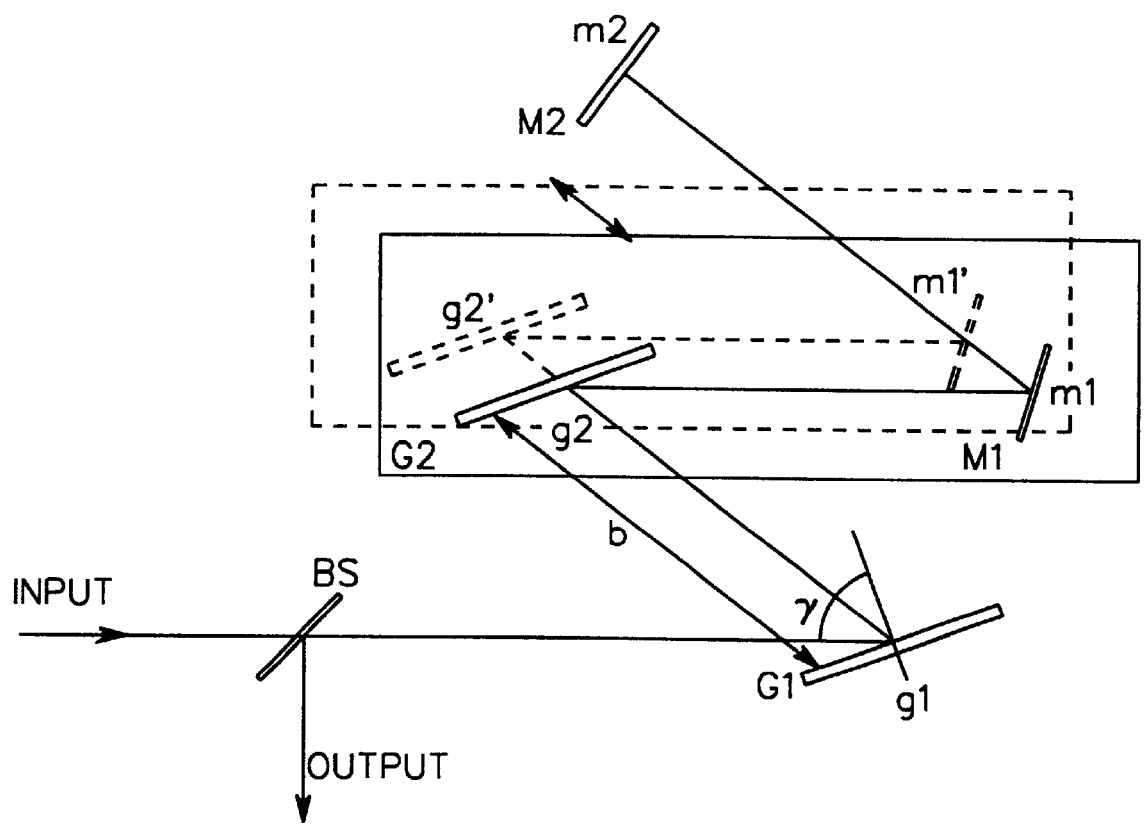
FIG. 17 is a schematic of one embodiment of an optical device in accordance with the principles of the present invention for chirping a laser pulse continuously by moving a translation stage, wherein the output direction and timing of the laser beam do not change during the optical pulse duration and the chirping rate adjustment.
Figure 18:
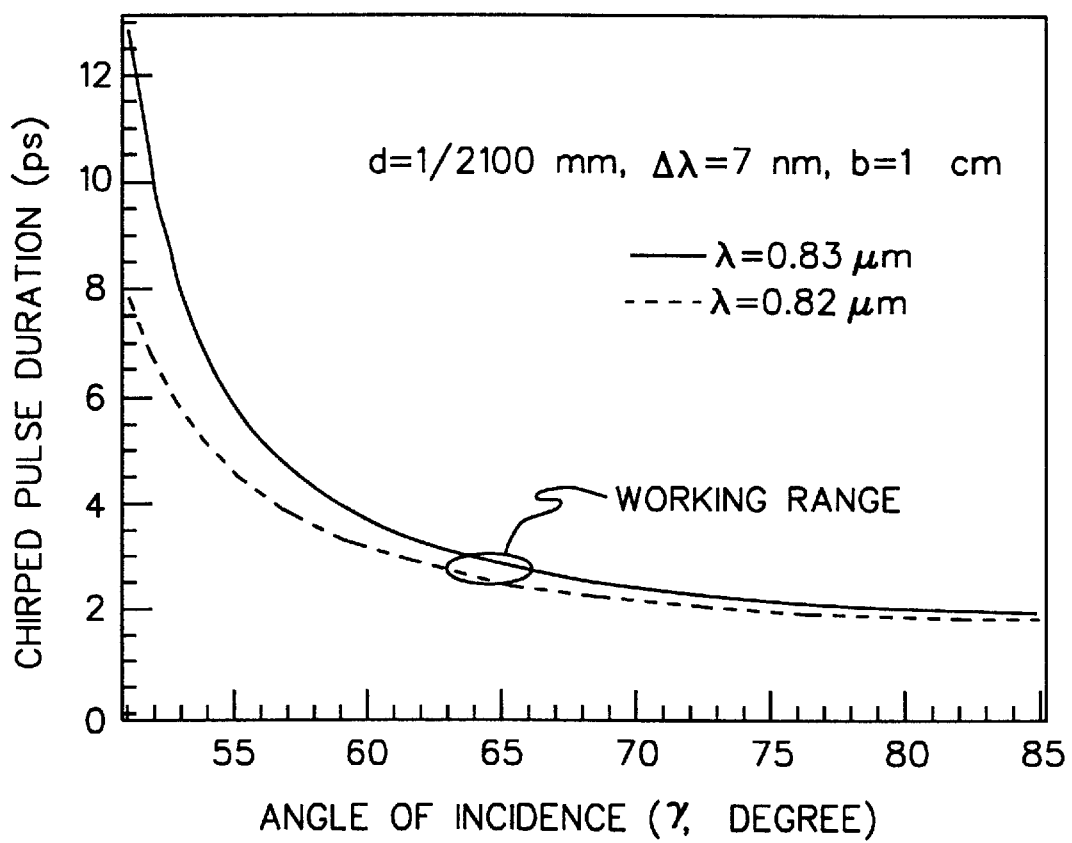
FIG. 18 is a graph of chirped pulse duration versus the angle of incidence relation for 1 cm slant distance b using the optical device of FIG. 17, wherein the ellipsoid shows the working range in one actual experiment.
Figure 19:
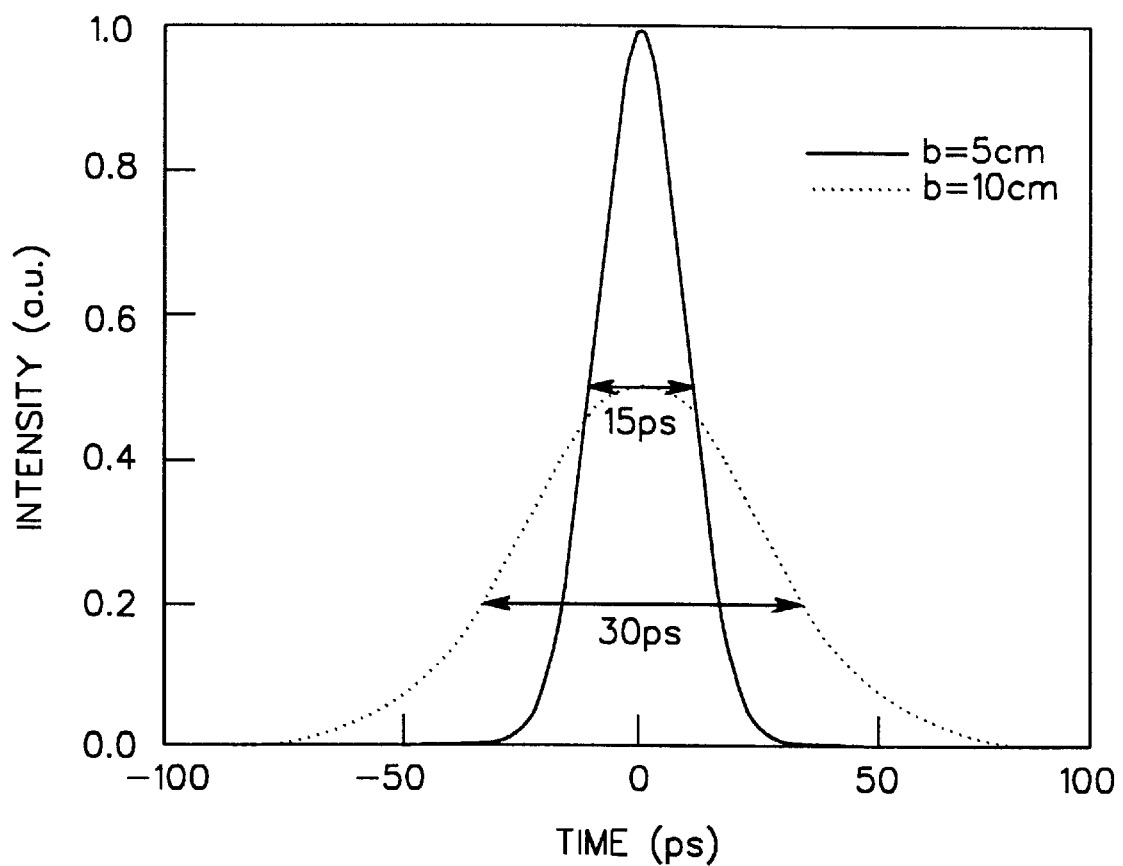
FIG. 19 is a graph of simulated chirp pulses in the time domain with two slant distances b=5 and 10 cm for the optical device of FIG. 17, wherein pulse widths of the full width at half maximum are 15 ps and 30 ps, respectively.

Next, a geometric design for an optical device which can chirp the laser pulse continuously by moving a translation stage is presented with reference to FIGS. 17–19. The output direction and timing of the laser beam do not change during the optical pulse duration and the chirping rate adjustment.

In chirped pulse measurement, the probe beam is spectrally chirped and temporally stretched by a pair of gratings. It is highly desired that the chirping rate and the chirped pulse duration be adjustable, but the direction and timing of the laser pulse remain unchanged. We have designed an apparatus to satisfy such requirements. This device improves the performance of the above-described chirped pulse method by simplifying the optical alignment procedure and keeping the same timing during the measurement.

Performance Requirements: There are two basic requirements for this setup; i.e.:
1. The direction of the output beam is fixed while adjusting the chirping rate; and
2. The total beam path is fixed so the timing is unchanged.

Once these two requirements are met, it is not necessary to readjust the probe beam (requirement 1) and not necessary to re-find the time zero (requirement 2).

FIG. 17 depicts one example of the setup. To realize the above performances, it is required that:
1. $\overline{m1m2}$ be in parallel with $\overline{g1g2}$;
2. G2 and M1 be on the same translation stage (dashed box); and the moving axis of the stage must be parallel with $\overline{g1g2}$, $\overline{m1m2}$;
3. Mirror M2 is perpendicular to $\overline{m1m2}$.

When the dashed box is moved by moving the translation stage, G2 and M1 at g2 and m1 are moved to the new positions g2' and m1' (dashed beam paths shown in FIG. 17). Because the moving axis of the dashed box is in parallel with $\overline{g1g2}$ or $\overline{m1m2}$, and the beam is reflected back along the incoming beam path, the direction of the output beam is unchanged during the movement. It is easily seen that $\overline{g2'm1'}=\overline{g2m1}$ and $\overline{g2g2'}=\overline{m1m1'}$, therefore the beam path or the timing is unchanged.

After passing through the device, the laser pulse is stretched, and the pulse duration is roughly the measurable time window. It is important to design the device with a proper pulse duration. The following is an analysis of one practical device.

When a pair of gratings are used to chirp the laser pulse duration $\Delta T_c$, after the grating pair the duration is given by:

$$\Delta T_c = \frac{b(\lambda/d)\Delta\lambda}{cd[1-(\lambda/d-\sin\gamma)^2]} \quad (27)$$

where $\lambda$ is the central wavelength, $\Delta\lambda$ the spectral width, c is the speed of light in vacuum, $d^{-1}$ is the groove density of the grating, $\gamma$ is the incident angle and b the slant distance between gratings. (See FIG. 17 for the definitions of $\gamma$ and b.) It is seen that for a given set of gratings and laser pulse, the chirped pulse duration is only determined by the slant distance b and the incident angle $\gamma$. Furthermore, when the incident angle is fixed, then the chirped pulse duration is proportional to the slant distance b. Therefore the pulse duration can be easily adjusted by changing the slant distance b.

In one example, $d=1/2100$ mm, $\lambda \approx 0.83$ $\mu$m & $\Delta\lambda=7$ nm. The chirped pulse duration versus the angle of incidence relation for b=1 cm is plotted in FIG. 18. The ellipsoid shows the working range of this device in the real experiment. Therefore we have roughly 3 ps/cm. Note that this value can be changed by changing the incident angle and the wavelength. Other parameters (such as the grating groove density and the spectral width) are substantially fixed. With b=6 cm, we have $\Delta T_c=18$ ps.

FIG. 19 is the simulated chirped pulses in time domain with 2 slant separations of the gratings, assuming Gaussian temporal pulse shape. The pulse duration is proportional to the slant distance b (see Equation 27). With approximate 3 ps/cm broadening, we have 15 to 30 ps Full Width at Half Maximum (FWHM). The centers of the pulses are at the same time position as required by the design.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for characterizing free-space radiation, said method comprising:
   providing one of an electro-optic crystal or a magneto-optic crystal;
   positioning the crystal so that the free-space radiation passes therethrough;
   generating a chirped optical probe signal and co-propagating the chirped optical probe signal through the crystal with the free-space radiation such that a temporal waveform of the free-space radiation is encoded onto a wavelength spectrum of the chirped optical probe signal; and
   decoding a characteristic of said free-space radiation using said chirped optical probe signal with said temporal waveform of the free-space radiation encoded on its wavelength spectrum.

2. The method of claim 1, wherein said free-space radiation comprises a free-space terahertz pulse, and wherein said chirped optical probe signal comprises a single-shot chirped optical probe signal.

3. The method of claim 1, wherein said generating comprises providing said chirped optical probe signal to impinge said crystal co-linearly in a same direction with said free-space radiation passing therethrough.

4. The method of claim 1, wherein said generating comprises velocity matching said chirped optical probe signal and said free-space radiation within said crystal.

5. The method of claim 1, wherein said decoding comprises extracting said temporal waveform of said free-space radiation by measuring a difference between a spectral distribution of said chirped optical probe signal passing through said crystal modulated by said free-space radiation and a spectral distribution of said chirped optical probe signal without modulation by said free-space radiation.

6. The method of claim 5, further comprising dynamically subtracting the spectral distribution of said chirped optical probe signal without said modulation from said spectral distribution of said chirped optical probe signal with said modulation.

7. The method of claim 1, wherein said generating comprises spectrally chirping and temporally stretching an optical probe signal to produce said chirped optical probe signal, wherein a chirping rate and a chirped pulse duration of said chirped optical probe signal are adjustable without changing direction and timing of said optical probe signal.

\* \* \* \* \*